(12) United States Patent
Minegishi et al.

(10) Patent No.: US 10,428,253 B2
(45) Date of Patent: Oct. 1, 2019

(54) PHOTOSENSITIVE RESIN COMPOSITION, FILM ADHESIVE, ADHESIVE SHEET, ADHESIVE PATTERN, SEMICONDUCTOR WAFER WITH ADHESIVE LAYER, AND SEMICONDUCTOR DEVICE

(71) Applicant: HITACHI CHEMICAL COMPANY, LTD., Tokyo (JP)

(72) Inventors: Tomonori Minegishi, Tsukuba (JP); Kazuyuki Mitsukura, Tsukuba (JP)

(73) Assignee: Hitachi Chemical Company, Ltd, Tokyo (JP)

( * ) Notice: Subject to any disclaimer, the term of this patent is extended or adjusted under 35 U.S.C. 154(b) by 0 days.

(21) Appl. No.: 14/904,145

(22) PCT Filed: Jul. 16, 2013

(86) PCT No.: PCT/JP2013/069303
§ 371 (c)(1),
(2) Date: Jan. 11, 2016

(87) PCT Pub. No.: WO2015/008330
PCT Pub. Date: Jan. 22, 2015

(65) Prior Publication Data
US 2016/0160102 A1   Jun. 9, 2016

(51) Int. Cl.
*C09J 179/08*   (2006.01)
*G03F 7/027*   (2006.01)
(Continued)

(52) U.S. Cl.
CPC .............. *C09J 179/08* (2013.01); *C09J 7/20* (2018.01); *G03F 7/027* (2013.01); *G03F 7/037* (2013.01);
(Continued)

(58) Field of Classification Search
CPC ............................................ H01L 2224/83856
See application file for complete search history.

(56) References Cited

U.S. PATENT DOCUMENTS

| | | | | |
|---|---|---|---|---|
| 6,342,333 B1* | 1/2002 | Sasaki | ................... | C08G 73/10 430/270.1 |
| 2007/0098995 A1* | 5/2007 | Masuko | ..................... | C09J 7/00 428/413 |

(Continued)

FOREIGN PATENT DOCUMENTS

| JP | H11-024257 A | 1/1999 |
|---|---|---|
| JP | 2000-290501 A | 10/2000 |

(Continued)

OTHER PUBLICATIONS

Office Action in counterpart JP Patent Application No. P2012-022121 dated Apr. 5, 2016.

(Continued)

*Primary Examiner* — Eugene Lee
(74) *Attorney, Agent, or Firm* — Fitch, Even, Tabin & Flannery LLP

(57) ABSTRACT

The present invention provides a photosensitive resin composition comprising: an alkali-soluble resin having a phenolic hydroxyl group as an end group (A); a radiation-polymerizable compound (B); and a photoinitiator (C), a film adhesive, an adhesive sheet, an adhesive pattern, a semiconductor wafer with an adhesive layer, and a semiconductor device using the photosensitive resin composition.

17 Claims, 12 Drawing Sheets

(51) Int. Cl.
*G03F 7/037* (2006.01)
*G03F 7/038* (2006.01)
*G03F 7/075* (2006.01)
*H01L 23/00* (2006.01)
*C09J 7/20* (2018.01)

(52) U.S. Cl.
CPC ............ *G03F 7/038* (2013.01); *G03F 7/0387* (2013.01); *G03F 7/0751* (2013.01); *H01L 24/27* (2013.01); *H01L 24/29* (2013.01); *H01L 24/81* (2013.01); *H01L 24/83* (2013.01); *H01L 24/92* (2013.01); *C09J 2201/122* (2013.01); *C09J 2203/326* (2013.01); *C09J 2205/31* (2013.01); *C09J 2479/08* (2013.01); *H01L 24/11* (2013.01); *H01L 24/13* (2013.01); *H01L 24/16* (2013.01); *H01L 24/32* (2013.01); *H01L 24/94* (2013.01); *H01L 2224/1132* (2013.01); *H01L 2224/1141* (2013.01); *H01L 2224/1148* (2013.01); *H01L 2224/131* (2013.01); *H01L 2224/1329* (2013.01); *H01L 2224/1339* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/13187* (2013.01); *H01L 2224/13339* (2013.01); *H01L 2224/13344* (2013.01); *H01L 2224/13347* (2013.01); *H01L 2224/13355* (2013.01); *H01L 2224/13364* (2013.01); *H01L 2224/13369* (2013.01); *H01L 2224/13387* (2013.01); *H01L 2224/16145* (2013.01); *H01L 2224/16227* (2013.01); *H01L 2224/271* (2013.01); *H01L 2224/27003* (2013.01); *H01L 2224/27436* (2013.01); *H01L 2224/27515* (2013.01); *H01L 2224/27618* (2013.01); *H01L 2224/27848* (2013.01); *H01L 2224/2919* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29387* (2013.01); *H01L 2224/29391* (2013.01); *H01L 2224/32145* (2013.01); *H01L 2224/32225* (2013.01); *H01L 2224/73104* (2013.01); *H01L 2224/81002* (2013.01); *H01L 2224/81203* (2013.01); *H01L 2224/83002* (2013.01); *H01L 2224/83203* (2013.01); *H01L 2224/83855* (2013.01); *H01L 2224/83856* (2013.01); *H01L 2224/83862* (2013.01); *H01L 2224/92* (2013.01); *H01L 2224/9211* (2013.01); *H01L 2224/94* (2013.01)

(56) References Cited

U.S. PATENT DOCUMENTS

| | | | | |
|---|---|---|---|---|
| 2007/0241434 | A1* | 10/2007 | Inada | H01L 24/83 257/678 |
| 2008/0261039 | A1* | 10/2008 | Tanaka | C09J 7/02 428/352 |
| 2009/0123867 | A1* | 5/2009 | Yuba | C08K 5/0025 430/270.1 |
| 2009/0166897 | A1* | 7/2009 | Katsurayama | C08G 59/18 257/793 |
| 2010/0178501 | A1* | 7/2010 | Masuko | C09J 4/06 428/355 N |
| 2011/0045639 | A1* | 2/2011 | Masuko | C08G 65/3322 438/118 |
| 2011/0159238 | A1* | 6/2011 | Kawamori | C08G 73/1042 428/141 |
| 2012/0133061 | A1* | 5/2012 | Mitsukura | C08G 73/1039 257/798 |
| 2012/0138868 | A1* | 6/2012 | Arifuku | B82Y 10/00 252/510 |
| 2012/0183781 | A1* | 7/2012 | Chuma | C08L 63/00 428/418 |
| 2012/0248632 | A1* | 10/2012 | Mitsukura | H01L 24/27 257/787 |
| 2012/0250268 | A1* | 10/2012 | Ito | C08G 18/348 361/748 |
| 2012/0263946 | A1* | 10/2012 | Mitsukura | H01L 21/67132 428/345 |
| 2013/0105998 | A1* | 5/2013 | Matsumura | C08G 73/1039 257/791 |
| 2013/0168859 | A1* | 7/2013 | Tanimoto | G03F 7/0226 257/738 |
| 2013/0214379 | A1* | 8/2013 | Niwa | C08G 73/1042 257/499 |
| 2014/0014928 | A1* | 1/2014 | Okumura | H01L 51/5296 257/40 |
| 2015/0024326 | A1* | 1/2015 | Nawrocki | G03F 7/0045 430/280.1 |

FOREIGN PATENT DOCUMENTS

| | | |
|---|---|---|
| JP | 2006-309202 A | 11/2006 |
| JP | 2007-016214 A | 1/2007 |
| JP | 2007180530 A | 7/2007 |
| JP | 3999840 B2 | 10/2007 |
| JP | 2008214549 A | 9/2008 |
| JP | 2009-258471 A | 11/2009 |
| JP | 2009-282491 A | 12/2009 |
| JP | 2010008639 A | 1/2010 |
| JP | 2010-077389 A | 4/2010 |
| JP | 2010092845 A | 4/2010 |
| JP | 2010237578 A | 10/2010 |
| JP | 2010256508 A | 11/2010 |
| JP | 2010-270293 A | 12/2010 |
| JP | 2011017898 | 1/2011 |
| JP | 2011-042775 A | 3/2011 |
| JP | 2011084658 A | 4/2011 |
| JP | 2011-095355 A | 5/2011 |
| JP | 2011-116968 A | 6/2011 |
| JP | 2011-123277 A | 6/2011 |
| JP | 2011-171586 A | 9/2011 |
| JP | 2011-237639 A | 11/2011 |
| JP | 2011-246627 A | 12/2011 |
| JP | 2013-160899 A | 8/2013 |
| TW | 201016815 A | 5/2010 |
| TW | 201202846 A | 1/2012 |
| TW | 201237101 A | 9/2012 |
| WO | 2007/004569 A1 | 1/2007 |
| WO | 2009/090922 A1 | 7/2009 |
| WO | 2010/073683 A1 | 7/2010 |
| WO | 2011/001942 A1 | 1/2011 |
| WO | 2011/058998 A1 | 5/2011 |
| WO | 2011/058999 A1 | 5/2011 |
| WO | 2011/125624 A1 | 10/2011 |
| WO | 2012/005079 A1 | 1/2012 |

OTHER PUBLICATIONS

Office Action in counterpart TW Patent Application No. 102125766 dated Dec. 13, 2016.
Office Action of TW Patent Application No. 102125766 dated Mar. 23, 2017.
International Search Report for PCT/JP2013/069303 dated Sep. 24, 2013; English translation submitted herewith (5 Pages).
International Preliminary Report on Patentability for PCT/JP2013/069303 dated Jan. 28, 2016 (8 Pages).
Office Action for Counterpart Japanese Application No. P2012-022121 dispatched dated Sep. 1, 2015 (4 Pages).

(56) References Cited

OTHER PUBLICATIONS

Office Action for Counterpart Japanese Application No. P2012-022121 dispatched dated Jan. 5, 2016 (7 Pages).

* cited by examiner

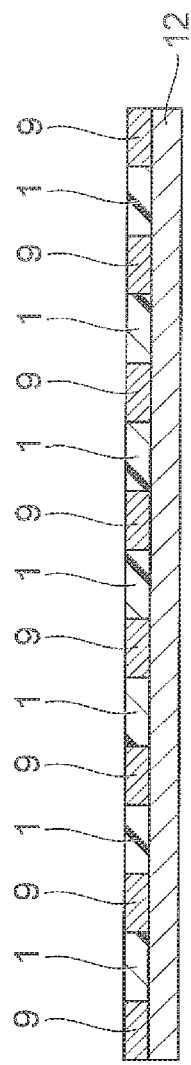

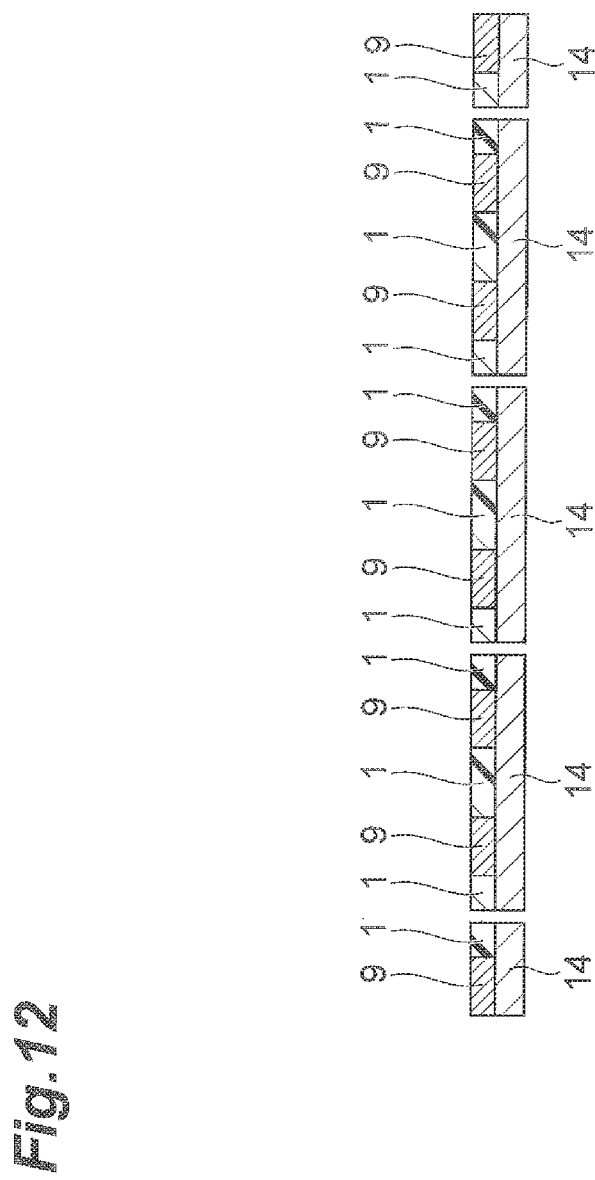

PHOTOSENSITIVE RESIN COMPOSITION, FILM ADHESIVE, ADHESIVE SHEET, ADHESIVE PATTERN, SEMICONDUCTOR WAFER WITH ADHESIVE LAYER, AND SEMICONDUCTOR DEVICE

TECHNICAL FIELD

The present invention relates to a photosensitive resin composition, as well as a film adhesive, an adhesive sheet, an adhesive pattern, a semiconductor wafer with an adhesive layer, and a semiconductor device using the same.

BACKGROUND ART

Various forms of semiconductor packages have been proposed in recent years as high performance and high function of electronic parts have been increased. In the manufacture of the semiconductor package, an adhesive is used in order to bond a semiconductor chip to a supporting member for mounting a semiconductor chip. Properties such as adhesion, thermocompression bondability, heat resistance, and humidity resistance are generally required of the adhesive, and attachment property is further required when the adhesive is used in a film form.

Adhesives with photosensitivity adequate to form a pattern in addition to the properties mentioned above may be required, depending on the functions, forms and methods for simplifying the assembly processes of the semiconductor packages. Photosensitivity is a function whereby portions irradiated with light are chemically altered to become insolubilized or solubilized in aqueous solutions or organic solvents. When a photosensitive adhesive exhibiting photosensitivity is used, it is exposed to light through a photomask and subjected to developing treatment, thus allowing a high definition adhesive pattern to be formed, and the formed adhesive pattern has thermocompression bondability to an adherend.

As photosensitive adhesive compositions, there are already known photoresists and polyimide resin precursor (polyamide acid)-based compositions (Patent Literatures 1 and 2 for example), and low-Tg polyimide resin-based compositions (Patent Literature 3). From the viewpoint of a work environment and an effluent treatment or the like, photosensitive adhesive compositions enabling pattern formation by an alkali developing solution are major.

In recent years, flip-chip mounting systems have attracted attention in the field of semiconductor packaging. In the flip-chip mounting systems, semiconductor chips are connected or a semiconductor chip and a supporting member for mounting a semiconductor chip are connected via a plurality of conductive bumps. In the flip-chip mounting system, by stress arising from the difference in thermal expansion coefficients of respective connecting members, connection defects between the base and semiconductor chip through the conductive bumps may be caused. Systems are known for sealing conductive bumps by filling a resin between the connecting members, in order to alleviate the stress (Patent Literature 4, for example).

CITATION LIST

Patent Literature

Patent Literature 1: Japanese Unexamined Patent Publication No. 2000-290501

Patent literature 2: Japanese Unexamined Patent Publication No. H11-24257

Patent Literature 3: International Publication No, WO07/004569

Patent Literature 4: Japanese Patent No. 3999840

SUMMARY OF INVENTION

Technical Problem

When a conventional liquid or film adhesive is used for the material for connecting the semiconductor chips or connecting the semiconductor chip and the supporting member for mounting a semiconductor chip, the following problem occurs. For example, in a case of the liquid adhesive, if the amount thereof applied is excessively high, the resin may run off from a chip in a bonding process, move up along the side surface of the chip and contaminate a bonding tool when a recent thin-film chip is mounted.

In contrast, in the case of the film adhesive, it is easy to apply an optimum amount of resin by adjusting the thickness of the film; however, a step of bonding the film adhesive to a base called a provisional compression-bonding step is required. Generally, in the provisional compression-bonding step, a film adhesive having slits at the intervals larger than the width of a target chip to be bonded, and wound around a reel is prepared, and the film adhesive on the base is cut depending upon the size of the chip and bonded to the base by thermocompression bonding at a temperature such that the resin does not react. However, it is difficult to supply the film with high dimensional accuracy to a chip mounting position, and to perform thin-width reel processing dealing with microchips or the like. From these, a film adhesive bonded in the provisional compression-bonding is generally made larger than a chip size in order to ensure yield. Therefore, there has been the following problem; the margin needs to be provided in a distance to an adjacent portion, which makes it difficult to deal with high-density mounting.

A method for forming an adhesive layer in a wafer process has attracted attention as the measure for solving the above problem. In order to form the adhesive layer in the wafer process, it is necessary to have for example flat film formability without depending on a level difference derived from a circuit, uniform highly precise pattern processability, and adaptability to a rewiring process, a connecting terminal forming process, and a dicing process or the like in addition to the conventional photosensitivity and adhesion.

The present invention has been made in consideration of these circumstances, and it is an object of the present invention to provide a photosensitive resin composition providing excellent pattern formability, film stability, and embedding property when the photosensitive resin composition is formed into a film shape and used, and sufficiently suppressing voids at the time of bonding at high temperature, a film adhesive, an adhesive sheet, an adhesive pattern, a semiconductor wafer with an adhesive layer, and a semiconductor device using the same.

Solution to Problem

In order to solve the problem, the present invention provides a photosensitive resin composition comprising: an alkali-soluble resin having a phenolic hydroxyl group as an end group (A); a radiation-polymerizable compound (B); and a photoinitiator (C).

Owing to the above constitution, the photosensitive resin composition of the present invention can sufficiently reduce moisture permeability of a connecting part protected by a curing resin under high temperature/high-humidity conditions even if the photosensitive resin composition is finely patterned, and bonds adherends, and furthermore the photosensitive resin composition contributes to an improvement in reliability of the semiconductor device of the present invention. Furthermore, owing to the above constitution, the photosensitive resin composition of the present invention has thermocompression bondability to an adherend including a supporting member for mounting a semiconductor chip having a circuit side, a semiconductor chip, or a semiconductor wafer after being formed into a film on the circuit side of a semiconductor wafer having the circuit side, patterned by exposure to light and development.

From the viewpoint of further improving connection reliability such as reflow resistance, a glass transition temperature (Tg) of the alkali-soluble resin is preferably 40 to 150° C., more preferably 50 to 120° C., and still more preferably 60 to 100° C. By setting the Tg of alkali-soluble resin to the above range, it is possible to ensure sufficient thermocompression bondability when a film adhesive obtainable by forming the photosensitive resin composition into a film shape is applied to the adherend, to thereby further improve the connection reliability.

From the viewpoint of high-temperature adhesion and pattern formability, the alkali-soluble resin is preferably a polyimide resin having phenolic hydroxyl groups as an end group and a side chain group, and more preferably a polyimide resin having only a phenolic hydroxyl group as an alkali-soluble group.

Furthermore, from the viewpoint of thermocompression bondability, high-temperature adhesion, pattern formability, and low moisture permeability, the alkali-soluble resin (A) is preferably a polyimide resin obtained by reacting a tetracarboxylic dianhydride, a diamine comprising 10 to 80 mol % of a diamine with a phenolic hydroxyl group based on the total diamine, and an amine with a phenolic hydroxyl group.

From the viewpoint of thermocompression bondability, high-temperature adhesion, pattern formability, and low moisture permeability, the diamine preferably comprises 10 to 80 mol % of an aliphatic etherdiamine represented by the following formula (8) based on the total diamine, in the formula, $R^1$ to $R^3$ each independently represent a C1-10 alkylene group; and b represents an integer of 2 to 80.

[Chemical Formula 1]

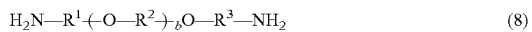

$$H_2N-R^1-(-O-R^2-)_b-O-R^3-NH_2 \quad (8)$$

Furthermore, from the viewpoint of thermocompression bondability, high-temperature adhesion, pattern formability, and low moisture permeability, the diamine with a phenolic hydroxyl group preferably comprises a diamine with a phenolic hydroxyl group represented by the following formula (A-1). In the formula, $R^{21}$ represents a single bond or a divalent organic group.

[Chemical Formula 2]

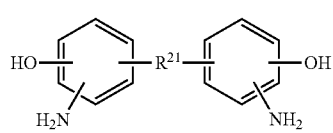

(A-1)

From the viewpoint of high-temperature adhesion, the radiation-polymerizable compound (B) preferably comprises at least one (meth)acrylate having functionality of three or more. Thereby, it is possible to improve storage modulus after exposure to light followed by heating curing, and as a result, it is possible to improve low moisture permeability.

From the viewpoint of thermocompression bondability, high-temperature adhesion, and moisture-proof reliability, it is preferable that the photosensitive resin composition comprising the component (A), the component (B), and the component (C) further comprise an epoxy resin (D), and from the viewpoint of thermocompression bondability, high-temperature adhesion, and moisture-proof reliability, it is preferable that the photosensitive resin composition further comprise a compound having an ethylenic unsaturated group and an epoxy group (E). Particularly, when photosensitive resin composition comprises the compound having an ethylenic unsaturated group and an epoxy group (E), it is possible to improve thermocompression bondability, and as a result, it is possible to improve low moisture permeability.

From the viewpoint of high-temperature adhesion, pattern formability, and moisture-proof reliability, the epoxy resin preferably comprises at least one of a bisphenol F-type epoxy resin and a bisphenol A-type epoxy resin.

From the viewpoint of film formability, high-temperature adhesion, and low moisture permeability, it is preferable that the photosensitive resin composition of the present invention further comprise a filler (F).

From the viewpoint of high-temperature adhesion, high heat resistance, and moisture-proof reliability it is preferable that the photosensitive resin composition of the present invention further comprise a curing accelerator (G).

It is possible to suitably use the photosensitive resin composition of the present invention as an adhesive for connecting semiconductor chips and/or connecting a semiconductor chip and a supporting member for mounting a semiconductor chip.

The present invention provides also a film adhesive obtainable by forming the photosensitive resin composition into a film shape.

The present invention provides also an adhesive sheet comprising a base, and an adhesive layer composed of the film adhesive formed on the base.

The present invention provides also an adhesive pattern obtained by exposing an adhesive layer to light, the adhesive layer composed of the film adhesive laminated on an adherend, and developing the exposed adhesive layer with an alkali developing solution.

The present invention provides also a semiconductor wafer with an adhesive layer, comprising a semiconductor wafer and an adhesive layer composed of the film adhesive and laminated on the semiconductor wafer.

The present invention provides also a semiconductor device having a structure in which semiconductor chips are bonded using the photosensitive resin composition and/or a structure in which a semiconductor chip and a supporting member for mounting a semiconductor chip are bonded using the photosensitive resin composition.

Advantageous Effects of Invention

The present invention can provide a photosensitive resin composition providing excellent pattern formability, film stability, and embedding property when the photosensitive resin composition is formed into a film shape and used, and sufficiently suppressing voids at the time of bonding at high temperature. The present invention can provide a film adhesive, an adhesive sheet, an adhesive pattern, a semiconductor wafer with an adhesive layer, and a semiconductor device using the photosensitive resin composition. In a circuit side on which the photosensitive resin composition of the present invention is formed into a film, a connecting terminal part can be arbitrarily exposed by patterning regardless of the size and height of the terminal part.

BRIEF DESCRIPTION OF DRAWINGS

FIG. 11 is an end view showing an embodiment of a method for manufacturing a semiconductor device of the present invention.

FIG. 12 is an end view showing an embodiment of a method for manufacturing a semiconductor device of the present invention.

DESCRIPTION OF EMBODIMENTS

Figure 1:
FIG. 1 is an end view showing an embodiment of a film adhesive of the present invention.

Embodiments for carrying out the present invention will now be described in detail, with reference to the accompanying drawings as necessary. However, the present invention is not limited to the embodiments described below. Throughout the drawings, corresponding elements will be referred to by same reference numerals and the duplicative description will be omitted. Unless otherwise specified, the vertical and horizontal positional relationships and the like are based on the positional relationships shown in the drawings, and the dimensional proportions in the drawings are not limited to the illustrated dimensions. Herein, a numerical representation of "A to B" refers to a range inclusive of the lower limit value A and the upper limit value B. Herein, "(meth)acrylate" refers to "acrylate" and "methacrylate" corresponding thereto. Other similar expressions such as "(meth)acrylic acid" are also the same.

Herein, the "attachment property" of a photosensitive resin composition refers to the attachment property when a film adhesive obtained by forming the photosensitive resin composition into a film shape is used. "High-temperature adhesion" of the photosensitive resin composition refers to the adhesion under heating, when the photosensitive resin composition has been cured. "Pattern formability" of the photosensitive resin composition refers to the precision of the adhesive pattern obtained upon exposing an adhesive layer made of the film adhesive formed on an adhered to light through a photomask and development by the alkali developing solution. "Thermocompression bondability" of the photosensitive resin composition refers to the degree of bonding when the adhesive pattern has been compression-bonded (thermocompression bonded) to a supporting member or the like under heating. "Heat resistance" of the photosensitive resin composition refers to peeling resistance under high temperature after the adhesive pattern has been thermocompression bonded to a supporting member or the like, and cured. The "reflow resistance" refers to peeling resistance after the frame-like pattern of the photosensitive adhesive has been thermocompression bonded to a supposing member or the like, cured, left for a predetermined time period under high temperature/high-humidity conditions, and subjected to reflow heating.

(Photosensitive Resin Composition)

The photosensitive resin composition of the present embodiment comprises an alkali-soluble resin having a phenolic hydroxyl group as an end group (A) (hereunder, may be simply referred to as a component (A)), a radiation-polymerizable compound (B) (hereunder, may be simply referred to as a component (B)), and a photoinitiator (C) (hereunder, may be simply referred to as a component (C)).

<Component (A)>

The Tg of the component (A) is preferably 150° C. or lower, more preferably 120° C. or lower and still more preferably 100° C. or lower. If the Tg is 150° C. or lower, it is possible to attach a film adhesive prepared by forming the photosensitive resin composition into a film shape to an adherend at low temperature, which can suppress occurrence of warping of a semiconductor wafer. It is also possible to lower the melt viscosity of the adhesive after pattern formation to further improve the thermocompression bondability.

The temperature for attaching the film adhesive to the back surface of the wafer is preferably 20 to 150° C., and more preferably 40 to 100° C. In the above range, the warping of the semiconductor wafer tends to be suppressed. In order to enable the attachment at the above temperature, the Tg of the component (A) is preferably 150° C. or lower. The lower limit of the Tg is preferably 40° C. or higher, more preferably 60° C., or higher, and most preferably 70° C. or higher. If the Tg is less than 40° C., it is necessary to blend a large amount of other curing component in order to improve the elastic modulus after exposure to light and heating curing, which tends to deteriorate manageability, storage stability, pattern formability, thermocompression bondability, heat resistance, and low-stress property.

Here, the "Tg" of the component (A) is a tan δ peak temperature measured using a viscoelasticity analyzer (trade name: "RSA-2", manufactured by Rheometrix), under conditions with a temperature-elevating rate of 5° C./min, a frequency of 1 Hz, and a measuring temperature of −150 to 300° C. for the component (A) formed into a film.

The weight-average molecular weight of the component (A) is preferably controlled to within the range of 5000 to 500000, more preferably 10000 to 300000, and still more preferably 10000 to 100000. If the weight-average molecular weight is within the above range, the strength, pliability and tack properties of the photosensitive resin composition formed into a sheet or film are satisfactory. The hot flow property is satisfactory, which makes it possible to ensure good embedding properties for level differences of wiring (concavoconvexities) on base surfaces. If the weight-average molecular weight is 5000 or more, the film formability can be further improved. On the other hand, if the weight-average molecular weight is 500000 or less, the hot flow property and the embedding property can be improved, and the solubility of the photosensitive resin composition for the alkali developing solution at the time of pattern formation can be further improved. Here, the "weight-average molecular weight" refers to the weight-average molecular weight measured in terms of polystyrene using a high-performance liquid chromatography (trade name: C-R4A, manufactured by Shimadzu Corp.).

If the Tg and weight-average molecular weight of the component (A) are within these ranges, it is possible to lower the attachment temperature onto wafers. Furthermore, it is possible to lower the heating temperature (thermocompression bonding temperature) for adhesive anchoring of the semiconductor chip to the supporting member for mounting a semiconductor chip, and to impart high-temperature adhesion while suppressing an increase in warping of the semiconductor chip. It is possible to effectively impart attachment property, thermocompression bondability and developability.

The component (A) has a phenolic hydroxyl group as an end group, but preferably has an alkali-soluble group also as a side chain group. Examples of the alkali-soluble group include an ethylene glycol group, a carboxyl group, a hydroxyl group, a sulfonyl group and a phenolic hydroxyl group. Among these, the phenolic hydroxyl group is preferable. The alkali-soluble group in the component (A) is more preferably only the phenolic hydroxyl group.

Examples of the component (A) include a polyester resin, a polyether resin, a polyimide resin, a polyamide resin, a polyamideimide resin, a polyetherimide resin, a polyurethane resin, a polyurethaneimide resin, a polyurethaneamidoimide resin, a siloxane polyimide resin, a polyesterimide resin, a copolymer thereof, a precursor thereof (polyamide acid or the like), and additionally a polybenzoxazol resin, a phenoxy resin, a polysulfone resin, a polyether sulfone resin, a polyphenylene sulfide resin, a polyester resin, a polyether resin, a polycarbonate resin, a polyether ketone resin, and a (meth)acrylic copolymer of 10000 to 1000000 in weight-average molecular weight, a novolac resin and a phenol resin. Those may be used singly or in combinations of two or more.

Among these, from the viewpoint of high-temperature adhesion, heat resistance, and film formability, the component (A) is preferably a polyimide resin. The polyimide resin may be obtained, for example, by condensation reaction of a tetracarboxylic dianhydride, a diamine, and a (monofunctional) amine having a phenolic hydroxyl group by a known process.

In the mixing molar ratio of the tetracarboxylic dianhydride and diamine in the condensation reaction, the total diamine is preferably 0.5 to 0.98 mol with respect to 1.0 mol as the total tetracarboxylic dianhydride, and more preferably 0.6 to 0.95 mol.

In the mixing molar ratio of the tetracarboxylic dianhydride and amine with a phenolic hydroxyl group in the condensation reaction, the total amine with a phenolic hydroxyl group is preferably 0.04 to 1.0 mol with respect to 1.0 mol as the total tetracarboxylic dianhydride, and more preferably 0.1 to 0.8 mol.

The tetracarboxylic dianhydride, the diamine, and the amine with a phenolic hydroxyl group may be added in any desired order.

It is preferable to use a more excessive amount of the tetracarboxylic dianhydride than that of the diamine in the condensation reaction. Thereby, an oligomer having a residue derived from the tetracarboxylic dianhydride at the end increases, and the phenolic hydroxyl group is introduced as an end group by reaction of the residue derived from the tetracarboxylic dianhydride with an amino group of the amine having a phenolic hydroxyl group described hereunder.

The reaction temperature in the condensation reaction is preferably 80° C. or lower, and more preferably 0 to 60° C. The viscosity of the reaction liquid gradually increases as the reaction proceeds, forming polyamide acid as the polyimide resin precursor. In order to prevent a reduction in the properties of the resin composition, the tetracarboxylic dianhydride is preferably one which has been subjected to a recrystallizing purifying treatment with acetic anhydride.

The polyimide resin in the present embodiment refers to a resin having an imide group. Specific examples thereof include, but are not particularly limited to, a polyimide resin, a polyamide imide resin, a polyurethane imide resin, a polyetherimide resin, a polyurethane amide imide resin, a siloxane polyimide resin, and a polyester imide resin.

The polyimide resin can be obtained by dehydratively ring-closing the condensation reaction product described above (polyamide acid). The dehydrative ring-closing can be carried out by a thermal ring-closing method using a heat treatment, and a chemical ring-closing method using a dehydrating agent, or the like.

Examples of the tetracarboxylic dianhydride used as a raw material of a polyimide resin include, but are not particularly limited to, pyromellitic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenyisilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylene bis(trimellitate anhydride), ethylenetetracarboxyl dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic acid)dianhydride, bicyclo[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4-bis(3,4-dicarboxyphenoxy) diphenyl sulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, and a tetracarboxylic dianhydride represented by the following formula (1). In the following formula (1), a represents an integer of 2 to 20.

[Chemical Formula 3]

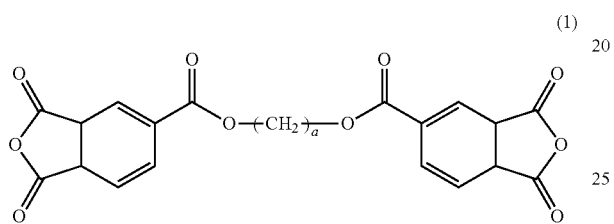

(1)

The tetracarboxylic dianhydride represented by the above formula (1) can be synthesized, for example, from an anhydrous trimellitic acid monochloride and a diol corresponding thereto, and specific examples thereof include 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride) and 1,18-(octadecamethylene)bis(trimellitate anhydride).

The tetracarboxylic dianhydride is preferably a tetracarboxylic dianhydride represented by the following formula (2) or (3) from the viewpoint of imparting a good solubility to a solvent, a humidity resistance, and the transparency to light with a wavelength of 365 nm.

[Chemical Formula 4]

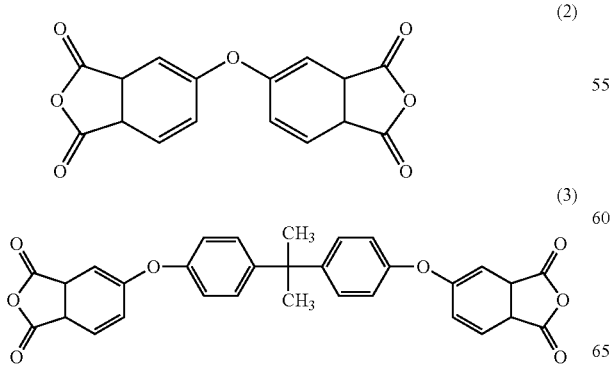

(2)

(3)

The tetracarboxylic dianhydride described above may be used singly or in combinations of two or more.

It is preferable to use at least one diamine having no carboxyl group but having a phenolic hydroxyl group as a diamine used as a raw material for the polyimide resin. It is possible to introduce the phenolic hydroxyl group as a side chain group of the polyimide resin by using the diamine having no carboxyl group but having a phenolic hydroxyl group. Examples of the diamine having no carboxyl group but having a phenolic hydroxyl group include aromatic diamines represented by the following formulae (5), (7), and (A-1), and from the viewpoint of obtaining good pattern formability and thermocompression bondability in a polyimide resin having high Tg, a diamine represented by the following formula (A-1) is more preferable.

[Chemical Formula 5]

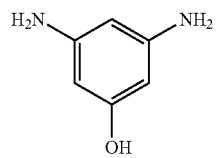

(5)

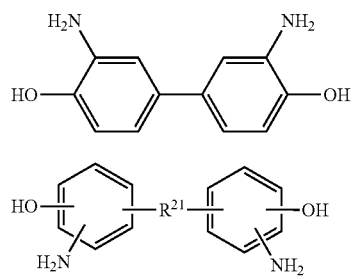

(7)

(A-1)

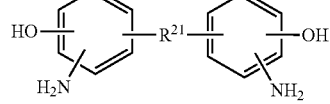

In the formula (A-1), $R^{21}$ represents a single bond or a divalent organic group. Examples of the divalent organic group include a C1-30 divalent hydrocarbon group, a C1-30 divalent hydrocarbon group in which some or all of hydrogen atoms are substituted with halogen atoms, —(C=O)—, —SO$_2$—, —O—, —S—, —NH—(C=O)—, —(C=O)—O—, a group represented by the following formula (B-1), and a group represented by the following formula (B-2). In the formulae (B-1) and (B-2), n represents an integer of 1 to 20, and R represents a hydrogen atom or a methyl group.

[Chemical Formula 6]

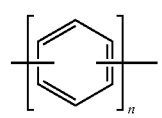

(B-1)

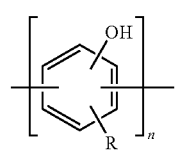

(B-2)

From the viewpoint of pattern formability when the Tg of the polyimide resin is increased, $R^{21}$ is preferably —C(CF$_3$)$_2$— or —C(CH$_3$)$_2$—. By using the diamine having such a group, the agglomeration of the imide groups of polyimide can be suppressed at the time of pattern formation, and the pattern formability can be improved because the alkali developing solution infiltrates easily. Thereby, even if the Tg of polyimide is increased, it is possible to obtain good pattern formability, and to achieve a photosensitive resin composition having further improved moisture-proof reliability.

The proportion of the diamine represented by the formula (A-1) is preferably 10 to 80 mol % of the total diamine, more preferably 20 to 80 mol %, and still more preferably 30 to 70 mol %. A carboxyl group-containing resin used as the polyimide resin tends to cause reaction with the added epoxy resin during heat drying, thereby significantly lowering the acid value of the polyimide resin. In contrast, if the side chains of the polyimide resin are phenolic hydroxyl groups, the reaction with the epoxy resin proceeds less easily than when they are carboxyl groups. As a result, it is considered that the pattern formability, thermocompression bondability and high-temperature adhesion are improved, and furthermore, the stability of the composition when the composition is in a varnish or film form is improved.

In the present embodiment, the diamine having a phenolic hydroxyl group preferably comprises a diphenol diamine having a fluoroalkyl group represented by the following formula (4). By introducing the fluoroalkyl group into a polyimide chain, the molecule chain cohesive force of polyimides is decreased, and the developing solution infiltrates easily. As a result, the pattern formability (soluble developability, thinning) of the photosensitive resin composition is further improved. A decrease in the cohesive force of polyimide can improve thermocompression bondability, and obtain good pattern formability even if the Tg of polyimide is increased. Thereby, it is possible to achieve a photosensitive resin composition having further improved moisture-proof reliability and reflow resistance.

[Chemical Formula 7]

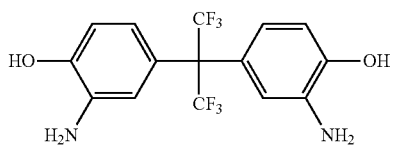

(4)

The diphenol diamine having a fluoroalkyl group preferably constitutes 5 to 100 mol % of the total diamine, more preferably 10 to 90 mol %, still more preferably 10 to 80 mol %, particularly preferably 20 to 80 mol %, and most preferably 30 to 70 mol %.

Examples of other diamine to be used as a raw material for the polyimide resin include, but are not particularly limited to, aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenyl methane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenylsulfone 4,4"-diaminodiphenylsulfone, 3,3'-diaminodiphenyl sulfide, 3,4-diaminodiphenyl sulfide, 4,4'-diaminodiphenyl sulfide, 3,3'-diaminodiphenylketone, 3,4'-diaminodiphenylketone, 4,4'-diaminodiphenylketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bis aniline, 3,4'-(1,4-phenylenebis(1-methylethylidene))bis aniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl) hexafluoropropane, 2,2-bis(4-(4-aminophenoxy)phenyl) hexafluoropropane, bis(4-(3-aminophenoxy)phenyl)sulfide, bis(4-(4-aminophenoxy)phenyl)sulfide, bis(4-(3-aminphenoxy)phenyl)sulfone, bis(4-(4-aminophenoxy)phenyl)sulfone, 3,3'-dihydroxy-4,4'-diaminobiphenyl and 3,5-diaminobenzoic acid; 1,3-bis(aminomethyl)cyclohexane, 2,2-bis (4-aminophenoxyphenyl)propane, an aliphatic etherdiamine represented by the following formula (8), and a siloxanediamine represented by the following formula (9). In the following formula (8), $R^1$, $R^2$, and $R^3$ each independently represent a C1-10 alkylene group, and b represents an integer of 2 to 80. In the following formula (9), $R^4$ and $R^9$ each independently represent a C1-5 alkylene group or a phenylene group; $R^5$, $R^6$, $R^7$, and $R^8$ each independently represent a C1-5 alkyl group, a phenyl group, or a phenoxy group; and d represents an integer of 1 to 5. The phenylene group may have a substituent.

[Chemical Formula 8]

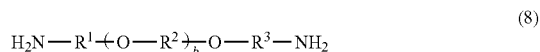

(8)

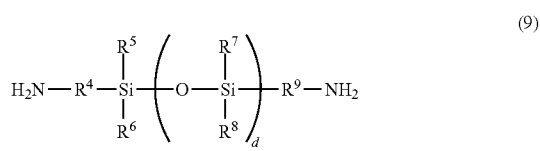

(9)

From the viewpoint of imparting compatibility with other components, organic solvent solubility, and alkali solubility, among the diamines described above, an aliphatic etherdiamine represented by the above formula (8) is preferable, and an ethyleneglycol- and/or propylene glycol-based diamine is more preferable.

Specific examples of the aliphatic etherdiamines include polyoxyalkylenediamines such as JEFFAMINE D-230, D-400, D-2000, D-4000, ED-600, ED-900, ED-2000 and EDR-148 manufactured by San Techno Chemical Co., Ltd., and polyetheramine D-230, D-400 and D-2000 manufactured by BASF. These diamines constitute preferably 1 to 80 mol %, more preferably 10 to 80 mol %, and still more preferably 10 to 60 mol % of the total diamine. If the amount is 1 mol % or more, it tends to be easier to impart high-temperature adhesion and hot flow property, while if it is 80 mol % or less, a decrease in the Tg of the polyimide resin is suppressed, which tends to further improve the self-supporting property of the film.

Furthermore, from the viewpoint of pattern formability, the aliphatic etherdiamine preferably has a propylene ether skeleton represented by the following formula, and a molecular weight of 300 to 600. When such a diamine is used, the amount thereof is preferably 80 mol % or less, and more preferably 60 mol % or less of the total diamine, from the viewpoint of the film self-supporting property, high-temperature adhesion, reflow resistance and moisture-proof reliability. The amount thereof is also preferably 10 mol % or more and more preferably 20 mol % or more of the total diamine, from the viewpoint of attachment property, thermocompression bondability and high-temperature adhesion. If the amount is within the above range, it is possible to adjust the Tg of the polyimide to the above range, and to impart attachment property, thermocompression bondability, high-temperature adhesion, reflow resistance and hermetic sealability. In the following formula, m represents an integer of 3 to 7.

[Chemical Formula 9]

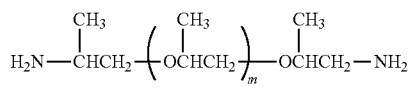

From the viewpoint of improving tight adhesiveness and adhesion at room temperature, the diamine component is preferably a siloxanediamine represented by the above formula (9).

Specific examples of siloxanediamines represented by the above formula (9) include as compounds wherein d in the formula (9) is 1: 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane and 1,3-dimethyl-1,3-dimethoxy-1,3-bis(4-aminobutyl)disiloxane, and as compounds wherein d is 2: 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane. The siloxanediamine represented by the above formula (9) is available as BY16-871EG (trade name, manufactured by Dow Corning Toray, Inc.), for example.

The above diamines may be used singly or in combinations of two or more. The amount of diamines described above is preferably 1 to 80 mol %, more preferably 2 to 50 mol %, and still more preferably 5 to 30 mol % of the total diamine. At 1 mol % or more, the effect of adding the siloxanediamine is sufficiently obtained, and at 80 mol % or less, the compatibility with other components, the high-temperature adhesion and the developability tend to be improved.

When the composition of the polyimide resin is determined, the composition of the polyimide resin is preferably designed so that the Tg is 150° C. or lower as described above, and as the diamine which is a raw material of the polyimide resin, it is particularly preferable to use the aliphatic etherdiamine represented by the above formula (8).

If the amine with a phenolic hydroxyl group is used when the polyimide resin is synthesized, the reaction between the residue derived from tetracarboxylic acid and the amino group of the amine having a phenolic hydroxyl group can introduce the phenolic hydroxyl group as an end group. Thereby, it is possible to decrease the weight-average molecular weight of the polymer and to improve developability and thermocompression bondability at the time of pattern formation.

The amine with a phenolic hydroxyl group is preferably an aminophenol derivative. Examples of the aminophenol derivative include amino cresols such as o-aminophenol, m-aminophenol p-aminophenol, and 2-amino-m-cresol, amino methoxy benzenes such as 2-amino-4-methoxy benzene, and -hydroxy dimethylanilines such as 4-hydroxy-2,5-dimethylaniline, but a compound represented by the following formula (10) is preferable. Among them, from the viewpoint of solubility in the alkali developing solution and stability for use in the varnish, a compound having a hydroxyl group at the meta-position of an amino group is preferable, and among these, m-aminophenol is easily introduced when the polyimide is synthesized, which is particularly preferable.

[Chemical Formula 10]

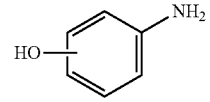

(10)

The polyimide resin having a phenolic hydroxyl group as an end group is preferable, because the pattern formability, thermocompression bondability, and high-temperature adhesion, and further stability when the composition is in a varnish or film form and embedding property (flatness) by application to or by laminating a base having a projection and a level difference such as a connecting terminal, are improved.

The above polyimide resins may be used singly or in combinations of two or more.

From the viewpoint of the photocuring property, the polyimide resin preferably has a transmittance of 10% or more and more preferably 20% or more for light with a wavelength of 365 nm, when molded into a 30 μm film shape. Such a polyimide resin can be synthesized, for example, by reacting an acid anhydride represented by the above formula (2) with an aliphatic ether diamine represented by the above formula (8) and/or a siloxane diamine represented by the above formula (9).

The content of the component (A) in the photosensitive resin composition of the present embodiment is preferably 10 to 90 mass %, more preferably 15 to 80 mass %, still more preferably 20 to 70 mass %, and particularly preferably 30 to 60 mass %, based on the total solid weight of the photosensitive resin composition. If the content is 10 mass % or more, the developability at the time of pattern formation tends to be more satisfactory, and the manageability such as tack properties tends to be more satisfactory. In contrast, if it is 90 mass % or less, the developability and adhesion at the time of pattern formation tend to be more satisfactory.

In a case where the alkali solubility of the polyimide resin is poor when the polyimide resin is blended as the component (A), a resin with a carboxyl group and/or hydroxyl group and/or a resin with a hydrophilic group may be added as a solubilizing aid. Examples of the resin with a hydrophilic group include, but are not particularly limited to, as long as it is an alkali-soluble resin, a resin with a glycol group, such as an ethylene glycol or propyleneglycol group.

<Component (B)>

Examples of the component (B) include a compound having an ethylenic unsaturated group. Examples of the ethylenic unsaturated group include a vinyl group, an allyl group, a butenyl group, a maleimide group, a nadimide group and a (meth)acryloyl group. From the viewpoint of reactivity, the ethylenic unsaturated group is preferably a (meth)acryloyl group, and the component (B) is preferably a (meth)acrylate having functionality of two or more. Examples of the (meth)acrylate include, but are not particularly limited to, diethyleneglycol diacrylate, triethyleneglycol diacrylate, tetraethyleneglycol diacrylate, diethyleneglycol dimethacrylate, triethyleneglycol dimethacrylate, tetraethyleneglycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 2-hydroxyethyl acrylate, 2-hydroxyethyl methacrylate, 1,3-acryloyloxy-2-hydroxypropane, 1,2-methacryloyloxy-2-hydroxypropane, methylenebisacrylamide, N,N-dimethylacrylamide, N-methylolacrylamide, tris (β-hydroxyethyl)isocyanurate triacrylate, compounds represented by the following formula (12), urethane acrylate, urethane methacrylate, and urea acrylate. In the following formula (12), $R^{19}$ and $R^{20}$ each independently represent a hydrogen atom or a methyl group, and g and h each independently represent an integer of 1 to 20.

group equivalent preferably has a polymerizable functional group equivalent of 300 g/eq or less, more preferably 250 g/eq or less, and still more preferably 200 g/eq or less. By using a radiation-polymerizable compound having a polymerizable functional group equivalent of 200 g/eq or less, having a glycol skeleton and an urethane bond and/or isocyanuric ring, it is possible to increase the developability and adhesion of the photosensitive resin composition, and to achieve low stress and low warping.

A radiation-polymerizable compound having a polymerizable functional group equivalent of 300 g/eq or more and a radiation-polymerizable compound having a polymerizable functional group equivalent of less than 300 g/eq, as the component (B) may also be used in combination. In this case, it is preferable to use a radiation-polymerizable compound having an urethane bond and/or isocyanuric ring as the component (B).

The content of the component (B) is preferably 10 to 500 parts by mass, more preferably 20 to 250 parts by mass, still more preferably 30 to 150 parts by mass, and particularly preferably 40 to 100 parts by mass with respect to 100 parts by mass of the component (A). The content of 500 parts by mass or less tends to suppress deterioration in the flow property during thermal-fusion due to polymerization, which tends to improve the adhesion at the time of thermocompression bonding. In contrast, the content of 10 parts by mass or more improves solvent resistance after the photocuring by exposure to light, enabling easily forming the pattern. In other words, film thickness variation between before and after development is decreased, which tends to provide less residue. Melting at the time of thermocompression bonding is difficult, which can prevent the deformation of the pattern.

<Component (C)>

From the viewpoint of an improvement in sensitivity, the component (C) preferably has the molecular extinction

[Chemical Formula 11]

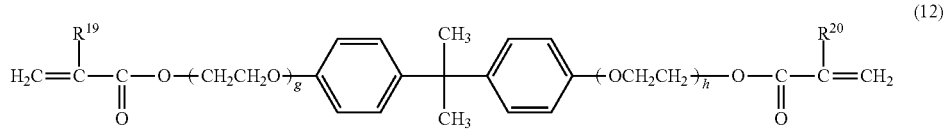

coefficient for light with a wavelength of 365 nm of 1000 ml/g·cm or more, and more preferably 2000 ml/g·cm or more. The molecular extinction coefficient is determined by preparing a 0.001 mass % acetonitrile solution of the sample and measuring the absorbance of the solution using a spectrophotometer (trade name: U-3310, manufactured by Hitachi High-Technologies Corp.).

When the photosensitive resin composition is formed into an adhesive layer with a film thickness of 30 μm or more, the component (C) preferably has an oxime ester skeleton, from the viewpoint of high sensitivity. Examples of the component (C) include 1-[4-(phenylthio)phenyl]octane-1,2-dione-2-(O-benzoyl oxime), and ethanone, 1-[9-ethyl-6-methylbenzoyl)-9H-carbazole-3-yl]-, 1-(O-acetyloxime). Another preferable examples of the component (C) include a component subjected to bleaching with photoirradiation from the viewpoint of an improvement in interior curability. Examples of such the component (C) include compounds which undergo photo-discoloration under UV irradiation, among aromatic ketones such as 2-benzyl-2-dimethylamino- The above radiation-polymerizable compounds may be used singly or in combinations of two or more. Among them, radiation-polymerizable compounds with a glycol skeleton, represented by the above formula (12), are preferable from the viewpoint of sufficiently imparting alkali solubility and solvent resistance after curing. Isocyanuric acid EO-modified di-/triacrylate and isocyanuric acid EO-modified di-/trimethacrylate are preferable from the viewpoint of sufficiently imparting pattern formability, high adhesion, heat resistance, and moisture-proof reliability after curing.

The component (B) preferably comprises an acrylate compound having functionality of three or more. This can further improve the adhesion after curing and inhibit outgas during heating. It is possible to improve the storage modulus after curing, which can provide good moisture-proof reliability.

By using such a radiation-polymerizable compound having a high functional group equivalent in combination, it is possible to achieve low stress and low warping. The radiation-polymerizable compound having a high functional 1-(4-morpholinophenyl)-butanone-1,2,2-dimethoxy-1,2-diphenylethan-1-one, 1-hydroxy-cyclohexyl-phenyl-ketone, 2-methyl-1-(4-(methylthio)phenyl)-2-morpholinopropanone-1,2,4-diethylthio-xanthone, 2-ethylanthraquinone, and phenanthrenquinone, benzyl derivatives such as benzyldimethylketal, 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-phenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, and 2-(2,4-dimethoxyphenyl)-4,5-diphenylimidazole dimer, acridine derivatives such as 9-phenylacridine and 1,7-bis(9,9'-acridinyl)heptane, and bisacylphosphine oxides such as bis(2,6-dimethoxybenzoyl)-2,4,4-trimethyl-pentylphosphine oxide and bis(2,4,6-trimethylbenzoyl)-phenylphosphine oxide. These may be used singly or in combinations of two or more.

The component (C) may comprise a photoinitiator which exhibits a function of promoting a curing reaction such as polymerization or addition reaction of an epoxy resin (D) described hereunder (hereunder, sometimes referred to as a component (D)) or a compound having an ethylenic unsaturated group and an epoxy group (E) (hereunder, sometimes referred to as a component (E)), by radiation irradiation. Examples of such the photoinitiators include photobase generators which generate bases by radiation irradiation, and photoacid generators which generate acids by radiation irradiation, and the photobase generators are particularly preferable.

Examples of the radiation include ionizing radiation and non-ionizing radiation, and specific examples thereof include excimer laser light such as ArF or KrF, extreme ultraviolet light, vacuum ultraviolet light, X-ray, ion beam, and ultraviolet light such as i-rays or g-rays.

By using the photobase generator, the generated base acts efficiently as a curing catalyst for the component (D) or the component (E). As a result, the crosslink density of the photosensitive resin composition further increases, and the high-temperature adhesion onto adherends and the humidity resistance of the photosensitive resin composition further improve. By adding the photobase generator in the photosensitive resin composition, it is possible to further reduce the outgas during standing at high temperature. Further, the curing process can also be accomplished at a lower temperature and in a shorter time.

The base can reduce the carboxyl group and/or hydroxyl group in the component (A) which remain after reaction of the component (A) with the component (D) and/or the component (E). Thereby, humidity resistance, adhesion, and pattern formability are improved.

As long as the photobase generator is a compound which generates bases upon radiation irradiation, the photobase generator may be used, without any particular limitations. Strongly basic compounds are preferable as bases to be generated, from the viewpoint of reactivity and curing speed.

Examples of such bases generated by radiation irradiation include imidazole and imidazole derivatives such as 2,4-dimethylimidazole and 1-methylimidazole, piperazine and piperazine derivatives such as 2,5-dimethylpiperazine, piperidine and piperidine derivatives such as 1,2-dimethylpiperidine, proline derivatives, trialkylamine derivatives such as trimethylamine, triethylamine and triethanolamine, pyridine derivatives with amino groups or alkylamino groups substituting at the 4-position, such as 4-methylaminopyridine and 4-dimethylaminopyridine, pyrrolidine and pyrrolidine derivatives such as n-methylpyrrolidine, dihydropyridine derivatives, alicyclic amine derivatives such as triethylenediamine and 1,8-diazabiscyclo(5,4,0)undecene-1 (DBU), and benzylamine derivatives such as benzylmethylamine, benzyldimethylamine and benzyldiethylamine.

As the photobase generators which generate such bases by radiation irradiation, there may be used, for example, quaternary ammonium salt derivatives described in Journal of Photopolymer Science and Technology 1999, Vol. 12, pp. 313-314 or Chemistry of Materials 1999, Vol. 11, pp. 170-176. These produce trialkylamines with high basicity by radiation irradiation, and are therefore optimal for curing of the epoxy resin.

As the photobase generators, there may be used carbamic acid derivatives described in Journal of American Chemical Society 1996, Vol. 118, p. 12925 or Polymer Journal 1996, Vol. 28, p. 795.

There may also be used oxime derivatives which generate primary amino groups by radiation irradiation, or commercially available photoradical generators such as 2-methyl-1-(4-(methylthio)phenyl)-2-morpholinopropan-1-one (trade name: IRGACURE 907, manufactured by Ciba Specialty Chemicals, Inc.), 2-benzyl-2-dimethylamino-1-(4-morpholinophenyl)-butanone-1 (trade name: IRGACURE 369, manufactured by Ciba Specialty Chemicals, Inc.) 2-(dimethylamino)-2-((4-methylphenyl)methyl)-1-(4-(4-morpholinyl)phenyl)-1-butanone (trade name: IRGACURE 379, manufactured by Ciba Specialty Chemicals, Inc.) and 3,6-bis-(2-methyl-2-morpholino-propionyl)-9-N-octylcarbazole (trade name: OPTOMER N-1414, manufactured by Adeka Corp.), and hexaarylbisimidazole derivatives (substituents such as halogens, an alkoxy group, a nitro group or a cyano group may be substituted with phenyl groups), and benzoisooxazolone derivatives.

The photobase generator may also employ a compound having a base-generating group introduced on the main chain and/or side chain of the polymer. In this case, from the viewpoint of adhesion, flow property, and heat resistance as an adhesive, the weight-average molecular weight is preferably 1000 to 100000, and more preferably 5000 to 30000.

Since the photobase generator does not exhibit reactivity with components (D) and (E) described hereunder when not exposed to radiation at room temperature, it has highly excellent storage stability at room temperature.

<Component (D)>

The photosensitive resin composition of the present embodiment can also comprise an epoxy resin (D) (hereunder, may be referred to as a component (D)). The component (D) preferably contains at least 2 or more epoxy groups in the molecule, from the viewpoint of high-temperature adhesion and reflow resistance, and is more preferably a glycidyl ether-type epoxy resin which is liquid or semi-solid at room temperature (25° C.), and specifically has a softening temperature of 50° C. or lower, from the viewpoint of pattern formability and thermocompression bondability. Examples of such resins include, but are not particularly limited to, bisphenol A-type, AD-type, S-type or F-type glycidyl ethers, hydrogenated bisphenol A-type glycidyl ethers, ethylene oxide-added bisphenol A-type glycidyl ethers, propylene oxide-added bisphenol A-type glycidyl ethers, trifunctional or tetrafunctional glycidyl ethers, glycidyl esters of dimer acids, and trifunctional or tetrafunctional glycidylamines. These may be used singly or in combinations of two or more.

The component (D) preferably has a 5% mass reduction temperature of 150° C. or higher, more preferably 180° C. or higher, still more preferably 200° C. or higher, and particularly preferably 260° C. or higher. The 5% mass reduction temperature of 150° C. or higher improves the low outgas property, the high-temperature adhesion and the reflow resistance.

The 5% mass reduction temperature is the 5% mass reduction temperature as measured for the sample using a Simultaneous Thermogravimetric Differential Thermal Analyzer (trade name: TG/DTA6300, manufactured by SII NanoTechnology Inc.) with a temperature-elevating rate of 10° C./min and under a nitrogen flow (400 ml/min).

It is preferable to use an epoxy resin represented by the following formula as the component (D). It is possible to sufficiently impart the 5% mass reduction temperature, the pattern formability, the high-temperature adhesion, the reflow resistance, and the moisture-proof reliability using such an epoxy resin.

[Chemical Formula 12]

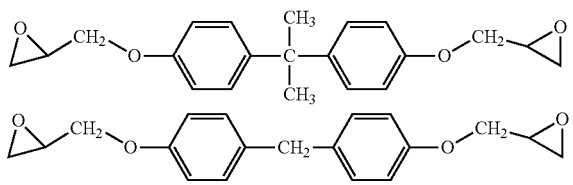

It is preferable to use a high-purity product in which a content of impurity ions such as alkali metal ions, alkaline earth metal ions and halogen ions, and particularly chloride ion or hydrolyzable chlorine, is reduced to 300 ppm or less, as the component (D). It is possible to more certainly prevent electromigration and corrosion of metal conductor circuits using the high-purity product with a reduced content of impurity ions.

The content of the component (D) is preferably 5 to 300 parts by mass, and more preferably 10 to 100 parts by mass, with respect to 100 parts by mass of the component (A). The content of 300 parts by mass or less tends to improve the solubility in an aqueous alkali solution, and the pattern formability. In contrast, the content of 5 parts by mass or more tends to provide sufficient thermocompression bondability and high-temperature adhesion.

The total amount of the component (D) and a component (E) described hereunder is preferably 20 parts by mass or more, and more preferably 30 parts by mass or more, with respect to 100 parts by mass of the component (A). When the Tg of the component (A) is 70° C. or higher, the total amount of the component (D) and the component (E) is preferably 30 parts by mass or more, more preferably 40 parts by mass or more, and still more preferably 50 parts by mass or more. When the total amount of the component (D) and the component (E) is in the above range, the melt viscosity after pattern formation can be reduced, and the pattern formability, the thermocompression bondability, the high-temperature adhesion, and the moisture-proof reliability can be improved.

<Component (E)>

The photosensitive resin composition of the present embodiment may also comprise a compound having an ethylenic unsaturated group and an epoxy group (E). The component (E) is different from the component (B) and the component (D). Examples of the ethylenic unsaturated group in the component (E) include a vinyl group, an allyl group, a butenyl group, a maleimide group, a nadimide group or a (meth)acryloyl group, and from the viewpoint of reactivity, the (meth)acryloyl group is preferable.

Examples of the component (E) include, but are not particularly limited to, glycidyl methacrylate, glycidyl acrylate, 4-hydroxybutyl acrylate glycidyl ether, 4-hydroxybutyl methacrylate glycidyl ether, and a compound obtained by reacting a compound having a functional group which reacts with an epoxy group and having an ethylenic unsaturated group, with a polyfunctional epoxy resin. Examples of the functional group which reacts with an epoxy group include, but are not particularly limited to, an isocyanate group, a carboxyl group, a phenolic hydroxyl group, a hydroxyl group, acid anhydride, an amino group, a thiol group and an amide group. These compounds may be used singly or in combinations of two or more.

It is possible to use a component (E) which is obtained, for example, by reacting a polyfunctional epoxy resin having at least two or more epoxy groups in one molecule thereof with 0.1 to 0.9 equivalents of (meth)acrylic acid with respect to one equivalent of the epoxy group in the presence of triphenylphosphine and/or tetrabutylammonium bromide. It is also possible to use a glycidyl group-containing urethane (meth)acrylate or the like obtainable by reacting a polyfunctional isocyanate compound with a hydroxy group-containing (meth)acrylate and a hydroxy group-containing epoxy compound, or obtained by reacting a polyfunctional epoxy resin with an isocyanate group-containing (meth)acrylate, in the presence of dibutyltin dilaurate.

The component (E) has a 5% mass reduction temperature of preferably 150° C. or higher, more preferably 180° C. or higher, still more preferably 200° C. or higher, and particularly preferably 260° C., or higher. The temperature of 150° C. or higher improves storage stability, adhesion, low outgas property of the package during assembly heating and after assembly, heat resistance, and humidity resistance.

Furthermore, the component (E) is preferably a high-purity product in which a content of impurity ions such as alkali metal ions, alkaline earth metal ions and halogen ions, and particularly chloride ion or hydrolyzable chlorine, is reduced to 1000 ppm or less. It is possible to more certainly prevent electromigration and corrosion of metal conductor circuits using the high-purity product with a reduced content of the impurity ions. For example, the above impurity ion concentration can be satisfied by using a polyfunctional epoxy resin with a reduced content of alkali metal ions, alkaline earth metal ions, halogen ions and the like as the raw material.

Examples of the component (E) satisfying the above heat resistance and purity include, but are not particularly limited to, those using bisphenol A-type, AD-type, S-type or F-type glycidyl ethers, hydrogenated bisphenol A-type glycidyl ethers, ethylene oxide-added bisphenol A and/or F-type glycidyl ethers, propylene oxide-added bisphenol A and/or F-type glycidyl ethers, phenol-novolac resin glycidyl ethers, cresol-novolac resin glycidyl ethers, bisphenol A-novolac resin glycidyl ethers, naphthalene resin glycidyl ethers, trifunctional or tetrafunctional glycidyl ethers, glycidyl ethers of dicyclopentadienephenol resins, glycidyl esters of dimer acids, trifunctional or tetrafunctional glycidylamines, and naphthalene resin glycidylamines, as the raw material.

From the viewpoint of improving thermocompression bondability, low-stress property and adhesion, and of maintaining developability at the time of pattern formation, the number of epoxy group and ethylenic unsaturated group of the component (E) is each preferably 3 or less, and in particular the number of the ethylenic unsaturated group is preferably 2 or less. Such the component (E) is not particularly limited, but it is preferable to use compounds represented by the following formulae (13) to (18), for example.

In the formulae (13) to (18), $R^{12}$ and $R^{16}$ represent hydrogen atoms or methyl groups, $R^{10}$, $R^{11}$, $R^{13}$ and $R^{14}$ represent divalent organic groups, and $R^{15}$, $R^{17}$, $R^{18}$ and $R^{19}$ represent organic groups with epoxy group or organic groups with ethylenic unsaturated group.

[Chemical Formula 13]

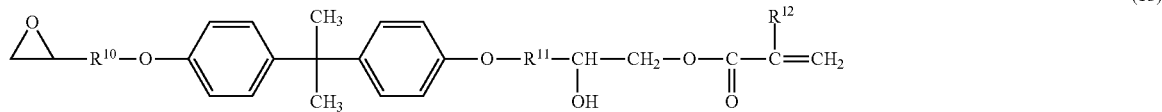

(13)

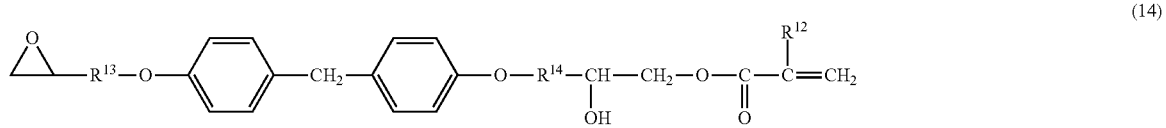

(14)

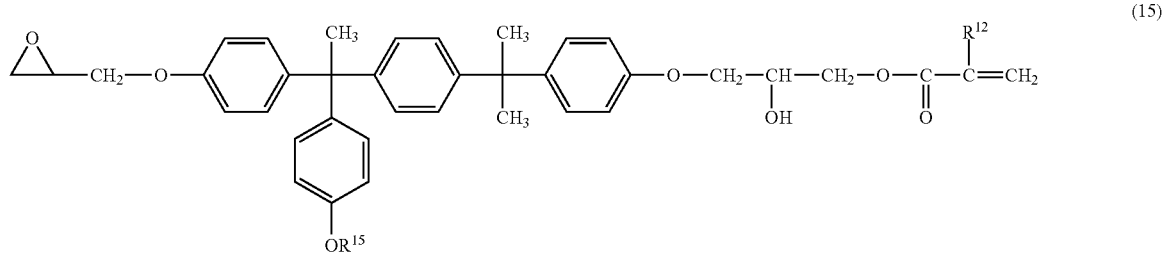

(15)

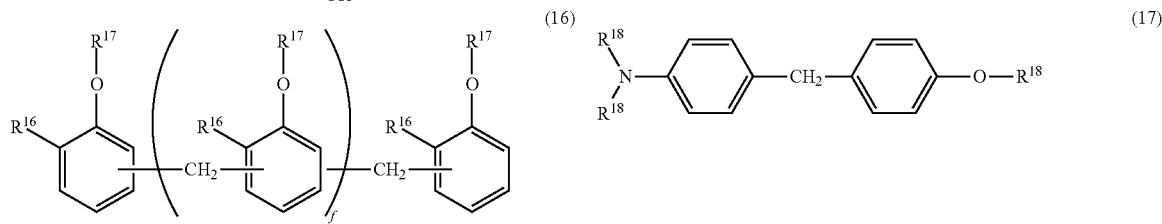

(16)

(17)

(18)

The compound represented by the above formula (13) or (14) is preferably used as the component (E). Thermocompression bondability is improved by using these compounds.

In the present embodiment, the content of the component (E) is preferably 5 to 300 parts by mass, more preferably 10 to 200 parts by mass, and still more preferably 20 to 100 parts by mass, with respect to 100 parts by mass of the component (A). If the content is 300 parts by mass or less, the thixotropic property tends to be improved at the time of film formation, which can make it easy to form a film, and the tack properties tend to decrease, which results in easier manageability. Developability tends to be improved at the time of pattern formation, and the melt viscosity after photocuring becomes high, which prevents deformation of the pattern at the time of thermocompression bonding. In contrast, if the content of the component (E) is 5 parts by mass or more, it is easy to sufficiently obtain an effect of addition. Since the component (E) serves as a spacer during photocuring while maintaining pattern formability and can reduce crosslink density, the component (E) can largely improve thermocompression bondability.

The photosensitive resin composition of the present embodiment may also comprise a curing agent as a curable component other than the component (E).

Examples of the curing agents include a phenol-based compound, aliphatic amine, alicyclic amine, aromatic polyamine, polyamide, aliphatic acid anhydride, alicyclic acid anhydride, aromatic acid anhydride, dicyandiamide, organic acid dihydrazide, boron trifluoride amine complex, imidazoles and tertiary amine.

Phenol-based compounds (different from the component (A)) are preferable among the above curing agents, and phenol-based compounds having at least two or more phenolic hydroxyl groups in the molecule are more preferable. Pattern formability is improved by using the phenol-based compounds. Examples of such compounds include phenol-novolac, cresol-novolac, t-butylphenol-novolac, dicyclopentadienecresol-novolac, dicyclopentadienephenol-novolac, xylylene-modified phenol-novolac, a naphthol-based compound, a trisphenol-based compound, tetrakisphenol-novolac, bisphenol A-novolac, poly-p-vinylphenol, and a phenolaralkyl resin.

Compounds with a number-average molecular weight in the range of 400 to 4000 are preferable among the phenol-based compounds. This can suppress outgas during heating, which causes contamination of the semiconductor chip or apparatus or the like during the heating for semiconductor device assembly. The content of the phenol-based compound is preferably 1 to 100 parts by mass, more preferably 2 to 50 parts by mass, and still more preferably 2 to 30 parts by mass, with respect to 100 parts by mass of the component (A). If the content is 100 parts by mass or less, reactivity between the compound having an ethylenic unsaturated group and an epoxy group and the radiation-polymerizable compound during exposure to light tends to be improved. Furthermore, the acid value of the resin decreases, which can suppress a reduction in the film thickness or swelling after development. Also, by decreasing infiltration of the developing solution into the resin pattern, outgas in the subsequent heating curing and in the thermal history of assembly tends to decrease, and the heat-resistant reliability and moisture-proof reliability tend to be improved. In contrast, if the content is 1 part by mass or more, more sufficient high-temperature adhesion tends to be easily obtained.

As the phenol compound, it is preferable to use a phenol compound represented by the following formula, from the viewpoint of obtaining a high 5% mass reduction temperature and imparting sufficient pattern formability. In the phenol compound, a ratio between the molar equivalent of the carboxyl group and phenolic hydroxyl group of the side chain of the component (A), and the phenolic hydroxyl group of the phenol compound in the resin composition and the molar equivalent of the epoxy groups of the component (D) and the component (E) [epoxy group/(carboxyl group and/or phenolic hydroxyl group)] is preferably 0.5 to 1.5, more preferably 0.7 to 1.4, and still more preferably 0.9 to 1.2. If the ratio of the epoxy group/(carboxyl group and/or phenolic hydroxyl group) is 0.5 or more, high-temperature adhesion, reflow resistance, and moisture-proof reliability tend to be improved. If the ratio is 1.5 or less, pattern formability, high-temperature adhesion, and moisture-proof reliability tend to be improved.

[Chemical Formula 14]

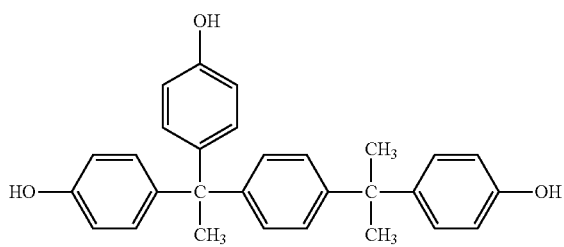

<Component (F)>

The photosensitive resin composition of the present embodiment can also comprise an appropriate filler (F) (hereunder, may be referred to as a component (F)). Examples of the filler (F) to be used include metal fillers such as silver powder, gold powder, copper powder and nickel powder, inorganic fillers such as alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, amorphous silica, boron nitride, titania, glass, iron oxide and ceramics, and organic fillers such as carbon and rubber-based fillers, without any particular limitations on the type or form or the like.

The component (F) may be selected for use according to the desired function. For example, the metal filler imparts electrical conductivity, thermal conductivity or thixotropic property or the like to the resin composition, and the inorganic filler imparts thermal conductivity, low thermal expansion property or low hygroscopicity or the like to the adhesive layer. The organic filler imparts toughness or the like to the adhesive layer.

The metal filler, the inorganic filler or the organic filler may be used singly or in combinations of two or more. Among them, the metal filler, the inorganic filler or an insulating filler is preferable. By using these fillers, electrical conductivity, thermal conductivity, low hygroscopicity and insulating property and the like, which are required for semiconductor device adhesive materials are imparted. Furthermore, among the inorganic filler and the insulating filler, a silica filler is more preferable. The silica filler can have satisfactory dispersibility in resin varnishes and impart high adhesive force when heated.

The component (F) preferably has a mean particle size of 10 μm or less and a maximum particle size of 30 μm or less, and more preferably a mean particle size of 5 μm or less and a maximum particle size of 20 μm or less. If the mean particle size is 10 μm or less and the maximum particle size is 30 μm or less, an effect of improved fracture toughness tends to be satisfactorily obtained. The lower limits for the mean particle size and the maximum particle size are not particularly limited, but both are preferably 0.001 μm or more from the viewpoint of manageability.

The content of the component (F) is determined according to the properties and function to be imparted, but it is preferably 0 to 50 mass %, more preferably 1 to 40 mass % and still more preferably 3 to 30 mass % with respect to the total mass of the resin component and filler. Increasing the amount of the filler can result in low coefficient of thermal expansion, low moisture absorption and a high elastic modulus, and can effectively improve dicing property (cuttability with a dicer blade), wire bonding property (ultrasonic efficiency) and bonding strength in heating.

If the content of the component (F) is 50 mass % or less, the thermocompression bondability and the pattern formability tend to be easily obtained. The optimal filler content is determined for the desired balance of properties. When the filler is used, mixing and kneading may be carried out using an appropriate combination of dispersers such as an ordinary stirrer, kneader, triple roll, and ball mill.

<Component (G)>

The photosensitive resin composition of the present embodiment can also comprise a curing accelerator (G) (hereunder, may be referred to as a component (G)). The component (G) is not particularly limited so long as it promotes epoxy curing and/or polymerization by heating. Examples of the component (G) include an aromatic nitrogen-containing compound, dicyandiamide derivative, dicarboxylic acid dihydrazide, triphenylphosphine, tetraphenylphosphonium tetraphenylborate, and 1,8-diazabicyclo [5.4.0]undecene-7-tetraphenylborate. Among them, imidazole compounds or salts thereof are preferable since both a promoting effect and stability can be achieved. Preferable examples thereof include 2-phenyl-4-methyl-5-hydroxymethylimidazole and 2-ethyl-4-methylimidazole-tetraphenylborate, which have a particularly high effect. The content of the component (G) the curing accelerator in the photosensitive resin composition is preferably 0.01 to 50 parts by mass with respect to 100 parts by mass of the epoxy resin (D).

Various coupling agents may also be added to the photosensitive resin composition of the present embodiment. The use of the coupling agent improves the interfacial bonding between different types of materials. Examples of the coupling agents include silane-based, titanium-based and aluminum-based agents, among which the silane-based coupling agents are preferable for a greater effect, and compounds having thermosetting groups such as an epoxy group or radiation-polymerizable groups such as methacrylate and acrylate are more preferable. The boiling point and/or decomposition temperature of the silane-based coupling agent is preferably 150° C. or higher, more preferably 180° C. or higher, and still more preferably 200° C. or higher. In other words, a silane-based coupling agent having a boiling point and/or decomposition temperature of 200° C. or higher, and having thermosetting groups such as an epoxy group or radiation-polymerizable groups such as methacrylate and acrylate is most preferably used. The amount of the coupling agent used is preferably 0.01 to 20 parts by mass with respect to 100 parts by mass of the component (A) which is used, from the viewpoint of the effect, heat resistance and cost.

An ion scavenger may also be added to the photosensitive resin composition of the present embodiment. The ion scavenger adsorbs ionic impurities and improves insulating reliability in moisture absorption. Examples of such an ion scavenger include, but are not particularly limited to, compounds known as copper inhibitors to prevent ionization and dissolution of copper, such as a triazinethiol compound and a phenol-based reducing agent, and inorganic compounds such as powdered bismuth-based, antimony-based, magnesium-based, aluminum-based, zirconium-based, calcium-based, titanium-based and tin-based compounds, as well as mixtures thereof.

Specific examples of the ion scavenger include, but are not particularly limited to, inorganic ion scavengers manufactured by Toagosei Co., Ltd. under the trade names of IXE-300 (antimony-based), IXE-500 (bismuth-based), IXE-600 (antimony/bismuth mixture-based), IXE-700 (magnesium/aluminum mixture-based), IXE-800 (zirconium-based) and IXE-1100 (calcium-based). These may be used singly or in combinations of two or more. The amount of the ion scavenger used is preferably 0.01 to 10 parts by mass with respect to 100 parts by mass of the component (A), from the viewpoint of effect of the addition, heat resistance, and cost and the like.

In the present embodiment, a sensitizing agent may be used in combination as necessary. Examples of the sensitizing agents include camphorquinone benzyl, diacetyl, benzyldimethylketal, benzyldiethylketal, benzyldi(2-methoxyethyl)ketal, 4,4'-dimethylbenzyl-dimethylketal, anthraquinone, 1-chloroanthraquinone, 2-chloroanthraquinone, 1,2-benzanthraquinone, 1-hydroxyanthraquinone, 1-methylanthraquinone, 2-ethylanthraquinone, 1-bromoanthraquinone thioxanthone, 2-isopropylthioxanthone, 2-nitrothioxanthone, 2-methylthioxanthone, 2,4-dimethylthioxanthone, 2,4-diethylthioxanthone, 2,4-diisopropylthioxanthone, 2-chloro-7-trifluoromethylthioxanthone, thioxanthone-10,10-dioxide, thioxanthone-10-oxide, benzoinmethyl ether, benzoinethyl ether, isopropyl ether, benzoinisobutyl ether, benzophenone, bis(4-dimethylaminophenyl)ketone, 4,4'-bisdiethylaminobenzophenone and compounds including azide groups. These may be used singly or in combinations of two or more.

In the present embodiment, a thermal radical generator may be used as necessary. The thermal radical generator is preferably an organic peroxide. The organic peroxide preferably has a 1 minute half-life temperature of 120° C. or higher, and more preferably 150° C. or higher. The organic peroxide is selected in consideration of the conditions for preparing the photosensitive resin composition, the film formation temperature, the curing (attachment) conditions, the other process conditions, and the storage stability or the like.

Examples of organic peroxides which may be used include, but are not particularly limited to, 2,5-dimethyl-2,5-di(t-butylperoxyhexane), dicumyl peroxide, t-butylperoxy-2-ethyl hexanate, t-hexylperoxy-2-ethyl hexanate, 1,1-bis(t-butylperoxy)-3,3,5-trimethylcyclohexane, 1,1-bis(t-hexylperoxy)-3,3,5-trimethylcyclohexane and bis(4-t-butylcyclohexyl)peroxy dicarbonate, and any one of these may be used singly, or two or more may be used in combination.

The amount of the thermal radical generator added is preferably 0.01 to 20 mass %, more preferably 0.1 to 10 mass %, and still more preferably 0.5 to 5 mass %, with respect to the total amount of the ethylenic unsaturated group-containing compound. If the amount is 0.01 mass % or more, the curability is increased and the effect of addition tends to be sufficiently obtained. If it is 5 mass % or less, the amount of outgas decreases and the storage stability tends to be improved.

The thermal radical generator is not particularly limited so long as it is a compound having a half-life temperature of 120° C. or higher, and examples thereof include PERHEXA 25B (manufactured by NOF Corp.), 2,5-dimethyl-2,5-di(t-butylperoxyhexane) (1 minute half-life temperature: 180° C.), Percumyl D (manufactured by NOF Corp.) and dicumyl peroxide (1 minute half-life temperature: 175° C.).

There may also be added polymerization inhibitors or antioxidants such as quinones, polyhydric phenols, phenols, phosphites and sulfur compounds to the photosensitive resin composition of the present embodiment, within ranges that do not impair the curability. By adding these components, higher storage stability, process adaptability, and antioxidant property are imparted.

In the photosensitive resin composition of the present embodiment, from the viewpoint of improving moisture-proof reliability and manageability, and of suppressing warping after heating curing, the Tg of the alkali-soluble resin (A) is preferably 40 to 150° C., and the storage modulus of the alkali-soluble resin (A) at 110° C. after heating curing is preferably 10 MPa or more. A photosensitive resin composition which comprises the alkali-soluble resin having such Tg and satisfies storage modulus of 10 MPa or more at 110° C. after heating curing can be obtained by combining the following components to be used, for example. That is, examples thereof include a photosensitive resin composition comprising: 20 to 500 parts by mass, and preferably 40 to 200 parts by mass of a radiation-polymerizable compound (B) having a radiation-polymerizable group equivalent of 400 g/eq or less, and preferably 250 g/eq or less; 0.5 to 20 parts by mass, and preferably 1 to 10 parts by mass of a photoinitiator (C); 5 to 300 parts by mass, and preferably 10 to 100 parts by mass of an epoxy resin (D) having an epoxy group equivalent of 400 g/eq or less, and preferably 250 g/eq or less; and 5 to 200 parts by mass, and preferably 10 to 100 parts by mass of a compound having an ethylenic unsaturated group and an epoxy group (E) having an aromatic ring, or an isocyanuric ring, with respect to 100 parts by mass of the alkali-soluble resin (A) having Tg of 40 to 150° C.

In the photosensitive resin composition of the present embodiment, from the viewpoint of improving moisture-proof reliability and manageability, and of suppressing warping after heating curing, the storage modulus at 110° C. after exposure to light followed by heating curing is preferably 1 GPa or less. Examples of the photosensitive resin composition satisfying such a condition include a photosensitive resin composition comprising: 20 to 500 parts by mass, and preferably 40 to 200 parts by mass of a radiation-polymerizable compound (B) having a radiation-polymerizable group equivalent of 400 g/eq or less, and preferably 250 g/eq or less; 0.5 to 20 parts by mass, and preferably 1 to 10 parts by mass of a photoinitiator (C); 5 to 300 parts by mass, and preferably 10 to 100 parts by mass of an epoxy resin (D) having an epoxy group equivalent of 400 g/eq or less, and preferably 250 g/eq or less; and 5 to 200 parts by mass, and preferably 10 to 100 parts by mass of a compound having an ethylenic unsaturated group and an epoxy group (E) having an aromatic ring, or an isocyanuric ring, with respect to 100 parts by mass of the alkali-soluble resin (A) having Tg of 40 to 150° C.

(Film Adhesive)

A film adhesive can be obtained by forming the photosensitive resin composition into a film shape. FIG. 1 is an end view showing an embodiment of a film adhesive of the present invention. The film adhesive 1 shown in FIG. 1 is prepared by forming the photosensitive resin composition into a film shape.

Figure 2:
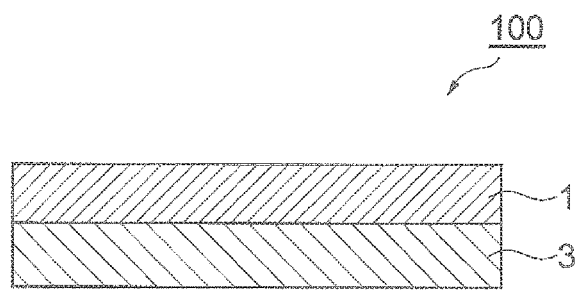
FIG. 2 is an end view showing an embodiment of an adhesive sheet of the present invention.

The film adhesive 1 is formed into a film shape by, for example, applying the photosensitive resin composition onto a base 3 as shown in FIG. 2, and drying it. Thereby, an adhesive sheet 100 including a base 3 and an adhesive layer 1 composed of the film adhesive formed on the base 3 can be obtained. FIG. 2 is an end view showing an embodiment of an adhesive sheet 100 of the present invention. The adhesive sheet 100 shown in FIG. 2 includes a base 3, and an adhesive layer 1 composed of a film adhesive provided on one side of the base.

Figure 3:
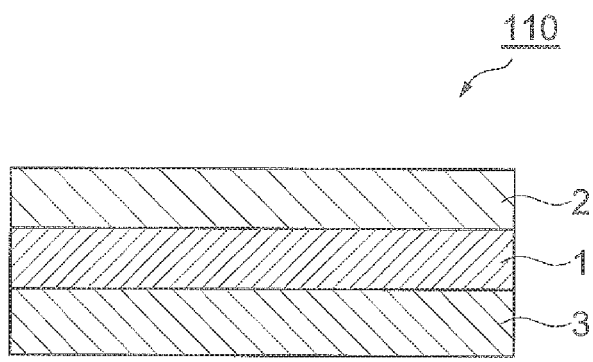
FIG. 3 is an end view showing an embodiment of an adhesive sheet of the present invention.

FIG. 3 is an end view showing another embodiment of an adhesive sheet of the present invention. The adhesive sheet 110 shown in FIG. 3 includes a base 3, an adhesive layer 1 composed of a film adhesive provided on one side of the base, and a cover film 2.

The film adhesive 1 can be obtained by the following method, for example. First, the component (A), the component (B), the component (C), and other components added as necessary are mixed in an organic solvent, and the mixture is kneaded to prepare a varnish. Next, the varnish is applied onto the base 3 to form a varnish layer, and the varnish layer is dried by heating, followed by removing the base 3. At this time, it may also be stored and used as an adhesive sheet 100 without removal of the base 3. It may also be stored and used as an adhesive sheet 110 with the cover film 2 laminated on a surface opposite to the surface of the adhesive layer 1 on which the base 3 is provided.

The organic solvent used to prepare the varnish, i.e. the varnish solvent, is not particularly limited so long as it can uniformly dissolve or disperse the material. Examples of the varnish solvent include dimethylformamide, toluene, benzene, xylene, methyl ethyl ketone, tetrahydrofuran, ethylcellosolve, ethylcellosolve acetate, dioxane, cyclohexanone, ethyl acetate and N-methyl-pyrrolidinone (N-methyl-2-pyrolidone).

The mixing and kneading can be carried out by an appropriate combination of an ordinary stirrer, kneader, dispersers such as triple roll and ball mill. The drying by heating is carried out at a temperature at which the component (B) does not sufficiently react, and under conditions in which the solvent sufficiently volatilizes. The "temperature at which the component (B) does not sufficiently react" is, specifically, a temperature equal to or lower than the peak temperature for heat of reaction, measured using a DSC (for example, trade name: Model DSC-7, manufactured by Perkin-Elmer), under conditions with a sample weight of 10 mg, a temperature-elevating rate of 5° C./min and a measuring atmosphere of air. Specifically, the varnish layer is dried by heating, usually at 60 to 180° C. for 0.1 to 90 minutes. The thickness of the varnish layer before drying is preferably 1 to 200 µm. If the thickness is less than 1 µm, an adhesive anchoring function tends to be not sufficient, while if the thickness is more than 200 µm, the residual volatile content described hereunder tends to increase.

The residual volatile content for the obtained film adhesive is preferably 10 mass % or less. If the residual volatile content is more than 10 mass %, voids easily remain in the interior of the adhesive layer due to expansion by volatilization of the solvent during the assembly heating, and humidity resistance tends to decrease. The possibility of contamination of the peripheral materials or members tends to increase by volatile components generated during heating. The conditions for measuring the residual volatilizing components are as follows. Specifically, for a film adhesive 1 cut to a size of 50 mm×50 mm, the residual volatile content (%) is obtained from the following formula, where the initial mass is defined as M1 and the mass after heating the film adhesive 1 for 3 hours in an oven at 160° C. is defined as M2.

$$\text{Residual volatile content (\%)} = [(M2-M1)/M1] \times 100$$

The base 3 is not particularly limited so long as it can withstand the drying conditions. For example, a polyester film, a polypropylene film, a polyethylene terephthalate film, a polyimide film, a polyetherimide film, a polyether naphthalate film and a methylpentene film may be used as the base 3. A film used as the base 3 may also be a multilayer film including a combination of two or more different types, and the surface may be treated with a silicone-based or silica-based release agent or the like.

(Semiconductor Wafer with Adhesive Layer)

Figure 4:
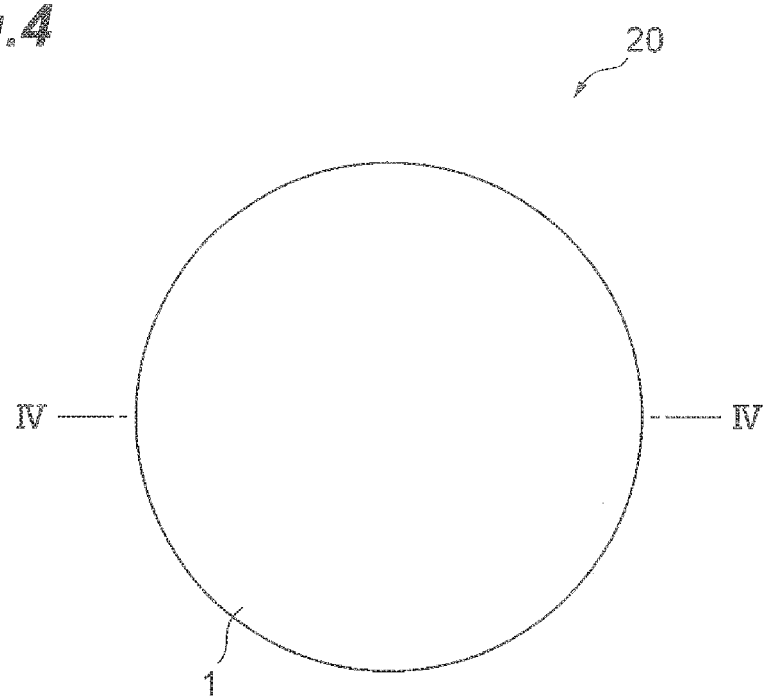
FIG. 4 is a top view showing an embodiment of a semiconductor wafer with an adhesive layer of the present invention.
Figure 5:
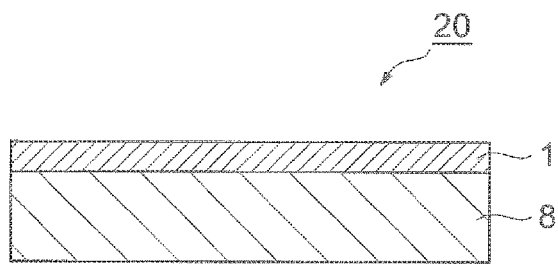
FIG. 5 is an end view of FIG. 4 along line IV-IV.

FIG. 4 is a top view showing an embodiment of a semiconductor wafer with an adhesive layer according to the present invention, and FIG. 5 is an end view of FIG. 4 along line IV-IV. The semiconductor wafer with an adhesive layer 20 shown in FIGS. 4 and 5 includes a semiconductor wafer 8, and a film adhesive (adhesive layer) 1 provided on one side of the semiconductor wafer.

The semiconductor wafer with an adhesive layer 20 can be obtained by laminating the film adhesive 1 on the semiconductor wafer 8 while heating. The film adhesive 1 can be attached to the semiconductor wafer 8 at a low temperature of, for example, room temperature (25° C.) to about 150° C.

(Semiconductor Device)

Figure 6:
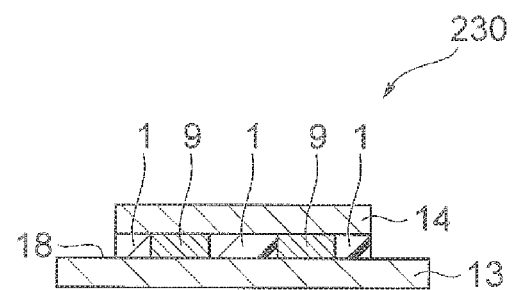
FIG. 6 is an end view showing an embodiment of a semiconductor device of the present invention.

FIG. 6 is an end view showing an embodiment of a semiconductor device according to the present invention. The semiconductor device 230 shown in FIG. 6 includes a supporting member (first adherend) 13 having a connecting electrode part (first connecting part: not shown), a semiconductor chip (second adherend) 14 having a connecting terminal (second connecting part: not shown), an adhesive layer 1 made of an insulating material, and a conductive layer 9 made of a conductive material. The supporting member 13 has a circuit side 18 opposing the semiconductor chip 14, and is disposed at a prescribed spacing from the semiconductor chip 14. The adhesive layer 1 is formed between the supporting member 13 and the semiconductor chip 14 in contact with each, and has a prescribed pattern. The conductive layer 9 is formed at the portions where the adhesive layer 1 is not disposed between the supporting member 13 and the semiconductor chip 14. The connecting terminal of the semiconductor chip 14 is electrically connected to the connecting electrode part of the supporting member 13 via the conductive layer 9.

A method for manufacturing the semiconductor device 230 shown in FIG. 6 will now be described in detail with reference to FIGS. 7 to 12. FIGS. 7 to 12 are end views showing embodiments of a method for manufacturing a semiconductor device according to the present invention. The method for manufacturing a semiconductor device according to the present embodiment includes the following (first step) to (fifth step).

Figure 7:
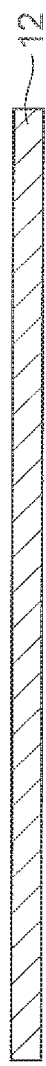
FIG. 7 is an end view showing an embodiment of a method for manufacturing a semiconductor device of the present invention.
Figure 8:
FIG. 8 is an end view showing an embodiment of a method for manufacturing a semiconductor device of the present invention.

(First Step) A step of providing an adhesive layer 1 on a semiconductor wafer 12 having a connecting electrode part (FIG. 7 and FIG. 8).

Figure 9:
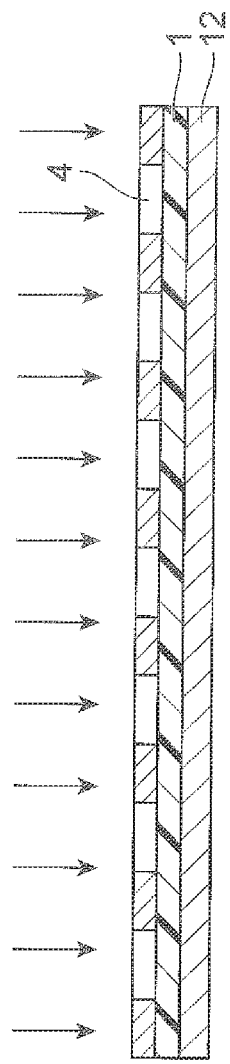
FIG. 9 is an end view showing an embodiment of a method for manufacturing a semiconductor device of the present invention.
Figure 10:
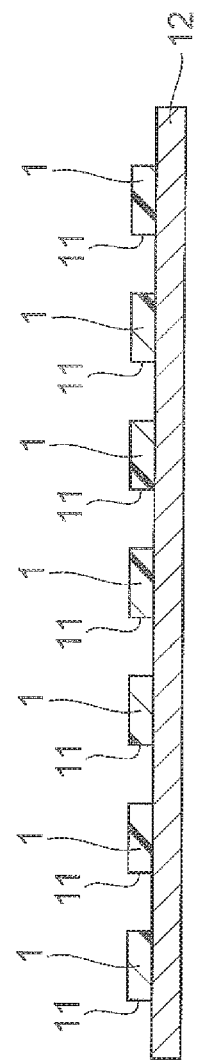
FIG. 10 is an end view showing an embodiment of a method for manufacturing a semiconductor device of the present invention.

(Second Step) A step of patterning the adhesive layer 1 by exposure to light and development so that openings 11 are formed where the connecting terminal is exposed (FIG. 9 and FIG. 10).

(Third Step) A step of forming a conductive layer 9 by filling a conductive material into the openings 11 (FIG. 11).

(Fourth Step) A step of dicing the stack including the semiconductor wafer 12, the adhesive layer 1 and the conductive layer 9 by semiconductor chips 14 (FIG. 12).

(Fifth Step) A step of directly bonding a supporting member 13 having a connecting electrode part to the adhesive layer 1 side of the individuated stack including the semiconductor chips 14 and adhesive layer 1, while electrically connecting the connecting electrode part of the supporting member 13 to the connecting terminals of the semiconductor chips 14 via the conductive layer 9 (FIG. 6).

Each of the (first step) to (fifth step) will now be described in detail.
(First Step)

An adhesive layer 1 is laminated on the circuit side of the semiconductor wafer 12 having the connecting electrode part shown in FIG. 7 (FIG. 8). As the laminating method, a method in which a film adhesive previously formed into a film shape is prepared and attached to the semiconductor wafer 12 is convenient, but laminating may be carried out by a method in which a liquid varnish containing the photosensitive resin composition is applied on the semiconductor wafer 12 using spin coating or the like, and is heat dried.

The photosensitive resin composition according to the present embodiment is a photosensitive resin composition capable of alkali development, which has adhesion for the adherend after it has been patterned by exposure to light and development. More specifically, resist pattern (adhesive pattern) formed by patterning the photosensitive resin composition by exposure to light and development has adhesion for adherends such as semiconductor chips and bases. The resist pattern and the adherends can be bonded by, for example, compression bonding the adherends onto the resist pattern with heating as necessary.
(Second Step)

The adhesive layer 1 provided on the semiconductor wafer 12 is irradiated with active light rays (typically ultraviolet rays) through a mask 4 having openings formed at prescribed locations (FIG. 9). The adhesive layer 1 is thus exposed to light in the prescribed pattern.

After exposure to light, the portions of the adhesive layer 1 which were not exposed to light are removed by development using an alkali developing solution, so that the adhesive layer 1 is patterned in a manner such that openings 11 are formed where the connecting terminal of the semiconductor wafer 12 is exposed (FIG. 10). A positive photosensitive resin composition may be used instead of a negative photosensitive resin composition, in which case the portions of the adhesive layer 1 exposed to light are removed by development.
(Third Step)

A conductive material is filled into the openings 11 of the obtained resist pattern to form a conductive layer 9 (FIG. 11). The method of filling the conductive material may be various methods such as gravure printing, indenting with a roll, or pressure reduction filling. Examples of the conductive material used herein include an electrode material made of, e.g. a metal such as solder, gold, silver, nickel, copper, platinum, or palladium or metal oxide such as ruthenium oxide, and bumps of such metals. Another examples thereof include a conductive material containing at least conductive particles and a resin component. Examples of the conductive particles to be used include conductive particles made of e.g. a metal such as gold, silver, nickel, copper, platinum, or palladium, metal oxide such as ruthenium oxide, or an organometallic compound, may be used. Examples of a resin component to be used include the curable resin composition described above, such as an epoxy resin and a curing agent thereof.
(Fourth Step)

The stack of the semiconductor wafer 12, adhesive layer 1 and conductive layer 9 is diced by the semiconductor chips 14 (FIG. 12).
(Fifth Step)

The supporting member 13 having a connecting electrode part is directly bonded to the adhesive layer 1 side of the individuated stack including the semiconductor chips 14 and the adhesive layer 1, while the connecting electrode part of the supporting member 13 is electrically connected to the connecting terminals of the semiconductor chips 14 via the conductive layer 9. A patterned adhesive layer (buffer coat film) may be formed on the circuit side of the semiconductor chip 14 opposite the adhesive layer 1 side.

Bonding of the semiconductor chip 14 is carried out by, for example, a method of thermocompression bonding while heating to a temperature at which the adhesive layer 1 (photosensitive resin composition) exhibits fluidity. After thermocompression bonding, the adhesive layer 1 is heated as necessary to further promote the curing reaction.

A back side protective film is preferably attached to the circuit side (back side) of the semiconductor chip 14 opposite the adhesive layer 1 side.

The semiconductor device 230 shown in FIG. 6 is obtained by the above method. The method for manufacturing a semiconductor device according to the present invention is not limited to the embodiments described above, and appropriate modifications can be made so long as not departing from the gist of the present invention.

For example, in the above manufacturing method, in the fourth step, the stack including the semiconductor wafer 12 and the adhesive layer 1 may be provided on the wafer-size supporting member 13 with the supporting member 13 directly bonded to the adhesive layer 1 side of the stack including the semiconductor wafer 12 and the adhesive layer 1 while electrically connecting the connecting terminal of the supporting member 13 with the connecting electrode part of the semiconductor wafer 12 via the conductive layer 9, and the stack including the semiconductor wafer 12, the adhesive layer 1 and the supporting member 13 may be diced by semiconductor chips 14 in the fifth step.

The step up to connection of the semiconductor wafer 12 and the supporting member 13 (fourth step) in the above manufacturing method is preferable from the viewpoint of working efficiency because it can be carried out with a wafer size. A back side protective film is preferably attached to the circuit side (back side) of the semiconductor wafer 12 opposite the adhesive layer 1 side.

The supporting member 13 may be a semiconductor chip or a semiconductor wafer, and in this case, a semiconductor device (semiconductor stack) can be constitute by bonding together semiconductor wafers, a semiconductor chip 14 and a semiconductor wafer (supporting member 13), or semiconductor chips. Through electrodes may also be formed in the stack. The above manufacturing method can also use a semiconductor wafer in which the conductive layer 9 has been formed in the connecting electrode part in the first step. In this case, the manufacturing method can form the openings 11 so that the conductive layer 9 is exposed in the second step, and proceed to the fourth step by skipping the third step.

EXAMPLES

The present invention will now be described in greater detail by examples. However, the present invention is not limited to the examples described below.

<Component (A): Alkali-Soluble Resin>

(PI-1)

In a 300 mL flask equipped with a stirrer, a thermometer, a nitrogen-substitution device (nitrogen inlet tube) and a moisture receptor-mounted reflux condenser, there were placed 14.64 g (0.04 mol) of the diamine 2,2-bis(3-amino-4-hydroxyphenyl)hexafluoropropane (trade name: BIS-AP-AF, molecular weight: 366, manufactured by Central Glass Co., Ltd.), 17.32 g (0.04 mol) of polyoxypropylene diamine (trade name: D-400, molecular weight: 433, manufactured by BASF), 2.485 g (0.01 mol) of 3,3'-(1,1,3,3-tetramethyl-disiloxane-1,3-diyl)bispropylamine (trade name: BY16-871EG, molecular weight: 248.5, manufactured by Toray/Dow Corning, Inc.), 2.183 g (0.02 mol) of m-aminophenol, and 80 g of the solvent N-methyl-2-pyrrolidone (hereunder abbreviated as "NMP"), and the mixture was stirred for dissolution of the diamine in the solvent.

Next, 31 g (0.1 mol) of 4,4'-oxydiphthalic dianhydride (hereunder abbreviated as "ODPA") was added to the solution in the flask in small portions at a time while cooling the flask in an ice bath. Upon completion of the addition, the solution was heated to 180° C. while blowing in nitrogen gas and held at that temperature for 5 hours, to obtain a polyimide resin PI-1. GPC measurement of (PI-1) yielded a result of weight-average molecular weight (Mw)=25000, based on polystyrene. The Tg of (PI-1) was 75° C. $^1$H-NMR confirmed no remaining carboxyl group.

(PI-2)

In a 300 mL flask equipped with a stirrer, a thermometer, a nitrogen-substitution device (nitrogen inlet tube) and a moisture receptor-mounted reflux condenser, there were placed 21.96 g (0.06 mol) of the diamine BIS-AP-A-F, 8.66 g (0.02 mol) of D-400, 2.485 g (0.01 mol) of BY16-871EG, 2.183 g (0.02 mol) of m-aminophenol, and 80 g of the solvent NMP, and the mixture was stirred for dissolution of the diamine in the solvent.

Next, 31 g (0.1 mol) of ODPA was added to the solution in the flask in small portions at a time while cooling the flask in an ice bath. Upon completion of the addition, the solution was heated to 180° C. while blowing in nitrogen gas and held at that temperature for 5 hours, to obtain a polyimide resin PI-2. GPC measurement of (PI-2) yielded a result of weight-average molecular weight (Mw)=28000, based on polystyrene. The Tg of (PI-2) was 100° C. $^1$H-NMR confirmed no remaining carboxyl group.

(PI-3)

In a flask equipped with a stirrer, a thermometer, a nitrogen-substitution device (nitrogen inlet tube) and a moisture receptor-mounted reflux condenser, there were placed 5.72 g (0.02 mol) of the diamine 5,5'-methylene bis(anthranilic acid) (trade name: MBAA, molecular weight: 286, manufactured by Wakayama Seika Co., Ltd.), 25.98 g (0.06 mol) of D-400, 2.48 g (0.01 mol) of BY16-871EG, and 110 g of the solvent NMP, and the mixture was stirred for dissolution of the diamine in the solvent.

Next, 31 g (0.1 mol) of ODPA was added to the solution in the flask in small portions at a time while cooling the flask in an ice bath. Upon completion of the addition, the solution was heated to 180° C. while blowing in nitrogen gas and held at that temperature for 5 hours, to obtain a polyimide resin PI-3. GPC measurement of (PI-3) yielded a result of (Mw)=30000, based on polystyrene. The Tg of (PI-3) was 45° C.

(PI-4)

In a flask equipped with a stirrer, a thermometer, a nitrogen-substitution device (nitrogen inlet tube) and a moisture receptor-mounted reflux condenser, there were placed 5.72 g (0.02 mol) of the diamine MBAA, 12.99 g (0.03 mol) of D-400, 2.48 g (0.01 mol) of BY16-871EG, 8.17 g (0.04 mol) of 1,4-butanediol bis(3-aminopropyl)ether (trade name: B-12, molecular weight: 204.31, manufactured by Tokyo Chemical Industry Co., Ltd.), and 110 g of the solvent NMP, and the mixture was stirred for dissolution of the diamine in the solvent.

Next, 27.9 g (0.09 mol) of ODPA and 3.84 g (0.02 mol) of TAA (trimellitic anhydride) were added to the solution in the flask in small portions at a time while cooling the flask in an ice bath. Upon completion of the addition, the solution was heated to 180° C. while blowing in nitrogen gas and held at that temperature for 5 hours, to obtain a polyimide resin PI-4. GPC measurement of (PI-4) yielded a result of (Mw)=21000, based on polystyrene. The Tg of (PI-4) was 55° C.

(PI-5)

In a 300 mL flask equipped with a stirrer, a thermometer, a nitrogen-substitution device (nitrogen inlet tube) and a moisture receptor-mounted reflux condenser, there were placed 7.32 g (0.02 mol) of the diamine BIS-AP-AF, 12.99 g (0.03 mol) of D-400, 6.12 g (0.03 mol) of B-12, and 2.485 g (0.01 mol) of BY16-871EG, and 80 g of the solvent NMP, and the mixture was stirred for dissolution of the diamine in the solvent.

Next, 31 g (0.1 mol) of ODPA was added to the solution in the flask in small portions at a time while cooling the flask in an ice bath. Upon completion of the addition, the solution was heated to 180° C. while blowing in nitrogen gas and held at that temperature for 5 hours, to obtain a polyimide resin PI-5. GPC measurement of (PI-5) yielded a result of weight-average molecular weight (Mw)=32000, based on polystyrene. The Tg of (PI-5) was 55° C. The Tg was obtained as follows here. Each of the obtained polyimide resins was applied onto a base (release agent-treated PET film) to a post-drying film thickness of 40 μm, and then heated in an oven at 80° C. for 20 minutes and subsequently heated at 120° C. for 20 minutes, to be formed into a film on a base. For the film peeled off from the base and laminated so that the thickness was 100 to 200 μm, a tan δ peak temperature measured using a viscoelasticity analyzer (trade name: RSA-2, manufactured by Rheometrix), under conditions with a temperature-elevating rate of 5° C./min, a frequency of 1 Hz and a measuring temperature of −150 to 300° C. was obtained as Tg.

<Component (E): Compound Having Ethylenic Unsaturated Group and Epoxy Group>
(E-1)

In a 500 mL flask equipped with a stirrer, a thermometer and a nitrogen-substitution device, there were placed 178 g (1.0 equivalent) of a liquid high-purity bisphenol A-bisglycidyl ether epoxy resin (manufactured by Tohto Kasei Co., Ltd., trade name: "YD-825GS", epoxy equivalent: 178 g/eq), 36 g (0.5 equivalents) of acrylic acid, 0.5 g of triphenylphosphine and 0.15 g of hydroquinone while being stirred, and the mixture was reacted at 100° C. for 7 hours, to obtain a compound E-1 having a carbon-carbon double bond and an epoxy group in the molecule. (E-1) was titrated with an ethanol solution of potassium hydroxide, and an acid value was confirmed to be 0.3 KOHmg/g or less (5% mass reduction temperature: 300° C., the number of epoxy groups: about 1, the number of (meth)acryloyl groups: about 1).

<Preparation of Photosensitive Resin Composition>

Using the polyimide resin, the compound having an ethylenic unsaturated group and an epoxy group obtained as described above, and other compounds shown below, each of the components was blended in the compositional ratios listed in Tables 1 and 3 below (units: parts by mass), to obtain photosensitive resin compositions (adhesive layer-forming varnishes) for Examples 1 to 5 and Comparative Examples 1 to 5.

In Tables 1 and 3, each abbreviation refers to the following.

<Component (B)>

M-313: isocyanuric acid EO-modified di- and triacrylate manufactured by Toagosei Co., Ltd. (radiation-polymerizable group equivalent: about 160 g/eq, 5% mass reduction temperature: >400° C.)

<Component (C)>

I-819: bis(2,4,6-trimethylbenzoyl)-phenylphosphine oxide manufactured by Ciba, Japan (5% mass reduction temperature: 210° C., molecular extinction coefficient at 365 nm: 2300 ml/g·cm)

I-OXE02: ethanone, 1-[9-ethyl-6-(2-methylbenzoyl)-9H-carbazol-3-yl]-, 1-(O-acetyloxime) manufactured by Ciba, Japan NMP: N-methyl-2-pyrolidone manufactured by Kanto Kagaku Co., Ltd.

<Component (D)>

YDF-870GS: Bisphenol F-type bisglycidyl ether manufactured by Tohto Kasei Co., Ltd. (epoxy equivalent: 165 g/eq, 5% mass reduction temperature: 270° C.)

<Component (F)>

R-972. Hydrophobic fumed silica (mean particle size: about 16 nm) manufactured by Nippon Aerosil Co., Ltd.

<Component (G)>

G-1: 2-phenyl-4-methyl-5-hydroxymethylimidazole

G-2: 2-ethyl-4-methylimidazole-tetraphenylborate

The 5% mass reduction temperature was measured under the following condition. The 5% mass reduction temperature was measured for the sample using a Simultaneous Thermogravimetric Differential Thermal Analyzer (trade name: "TG/DTA6300", manufactured by SII NanoTechnology Inc.) with a temperature-elevating rate of 10° C./min and under a nitrogen flow (400 ml/min). The molecular extinction coefficient was determined by preparing a 0.001 mass % acetonitrile solution of the sample and measuring the absorbance of the solution using a spectrophotometer ("U-3310" (trade name), manufactured by Hitachi High-Technologies Corp.).

The photosensitive resin compositions obtained in Examples 1 to 5 and Comparative Examples 1 to 5 were evaluated according to an evaluation test method described hereunder. The results are shown in Tables 2 and 4.

TABLE 1

| | Component (A) | Component (B) | Component (C) | Component (D) | Component (E) | Component (F) | Component (G) |
|---|---|---|---|---|---|---|---|
| Example 1 | PI-1 (100) | M-313 (80) | I-819 (2) I-OXE-02 (1) | YDF-870GS (30) | E-1 (30) | R-972 (10) | G-1 (1) |
| Example 2 | PI-2 (100) | M-313 (80) | I-819 (2) I-OXE-02 (1) | YDF-870GS (30) | E-1 (30) | R-972 (10) | G-1 (1) |
| Example 3 | PI-1 (100) | M-313 (80) | I-819 (3) | YDF-870GS (30) | E-1 (30) | R-972 (10) | G-1 (1) |
| Example 4 | PI-1 (100) | M-313 (80) | I-819 (3) | YDF-870GS (30) | E-1 (30) | R-972 (10) | G-2 (1) |
| Example 5 | PI-1 (100) | M-313 (80) | I-819 (3) | YDF-870GS (30) | E-1 (30) | R-979 (10) | None |

TABLE 2

| | Tg of component (A) (° C.) | Pattern formability | Film stability | Embedding property for base with connecting terminal | Tg after curing (° C.) | High-temperature adhesion Adhesive force (MPa) | Voids | Reflow resistance |
|---|---|---|---|---|---|---|---|---|
| Example 1 | 75 | A | A | A | 125 | 9.3 | A | A |
| Example 2 | 100 | A | A | A | 180 | >10 | A | A |
| Example 3 | 76 | A | A | A | 130 | >10 | A | A |
| Example 4 | 75 | A | A | A | 125 | >10 | A | A |
| Example 5 | 75 | A | A | A | 115 | 6.4 | B | B |

The photosensitive resin compositions of Examples 1 to 5 having only a phenol group as an alkali-soluble group in the alkali-soluble resin enabled thin line pattern formation having line width/space width=30 μm/30 μm or less, and provided good embedding property for the base with a connecting terminal. Therefore, the photosensitive resin compositions of Examples 1 to 5 can be suitably used as a material for connecting semiconductor chips, and/or a material for connecting a semiconductor chip and a supporting member for mounting a semiconductor chip. Furthermore, the photosensitive resin compositions of Examples 1 to 5 had also excellent film stability. Among them, the photosensitive resin compositions of Examples 1 to 4 containing the component (G) had better reflow resistance, and enabled voidless adhesion.

(High-Temperature Adhesion)

The obtained stack was exposed to light at 1000 mJ/cm$^2$ using a high-precision parallel exposure apparatus (trade name: EXM-1172-B-∞, manufactured by Orc Manufacturing Co., Ltd.), from the adhesive sheet side, and heated on a hot plate at 80° C. for 30 seconds. After the base (PET film) was peeled off and removed, spray development was carried out using a conveyor developing machine (manufactured by Yako Co., Ltd.) with a 2.38 mass % solution of tetramethylammonium hydroxide (TMAH) as the developing solution, under conditions with a temperature of 26° C. and a spray pressure of 0.18 MPa, and then the resultant was washed for 6 minutes with purified water at a temperature of 25° C. under a condition with a spray pressure of 0.02 MPa,

TABLE 3

|  | Component (A) | Component (B) | Component (C) | Component (D) | Component (E) | Component (F) | Component (G) |
| --- | --- | --- | --- | --- | --- | --- | --- |
| Comparative Example 1 | PI-3 (100) | M-313 (80) | I-819 (2) I-OXE-02 (1) | YDF-870GS (30) | E-1 (30) | R-972 (10) | G-1 (1) |
| Comparative Example 2 | PI-4 (100) | M-313 (80) | I-819 (2) I-OXE-02 (1) | YDF-870GS (30) | E-1 (30) | R-972 (10) | G-1 (1) |
| Comparative Example 3 | PI-5 (100) | M-313 (80) | I-819 (2) I-OXE-02 (1) | YDF-870GS (30) | E-1 (30) | R-972 (10) | G-1 (1) |
| Comparative Example 4 | PI-3 (100) | M-313 (80) | I-819 (2) I-OXE-02 (1) | YDF-870GS (30) | E-1 (30) | R-972 (10) | None |
| Comparative Example 5 | PI-3 (100) | M-313 (80) | I-819 (2) I-OXE-02 (1) | None | None | R-972 (10) | None |

TABLE 4

|  | Tg of component (A) (° C.) | Pattern formability | Film stability | Embedding property for base with connecting terminal | Tg after curing (° C.) | High-temperature adhesion Adhesive force (MPa) | Voids | Reflow resistance |
| --- | --- | --- | --- | --- | --- | --- | --- | --- |
| Comparative Example 1 | 45 | C | D | C | 70 | 9.2 | B | C |
| Comparative Example 2 | 55 | D | D | B | 75 | 6.2 | C | C |
| Comparative Example 3 | 55 | B | C | B | 75 | 8.1 | B | B |
| Comparative Example 4 | 45 | C | D | C | 70 | 6.8 | C | C |
| Comparative Example 5 | 45 | C | D | C | 55 | 3.8 | C | C |

<Adhesive Sheet>

Each of the obtained photosensitive resin compositions was applied onto a base (release agent-treated PET film) to a post-drying film thickness of 40 μm, and then heated in an oven at 80° C. for 20 minutes and subsequently heated at 120° C. for 20 minutes, to form an adhesive layer containing a photosensitive resin composition on the base. Thus, adhesive sheets having bases and adhesive layers formed on the bases were obtained.

<Evaluation Test>

A silicon wafer (6-inch diameter, thickness: 400 μm) was placed on a support stage, and the adhesive sheet was laminated thereover with the adhesive layer contacting the surface of the silicon wafer (the side opposite the support stage), by roll pressing (temperature: 80° C., linear pressure: 39.2 N/cm (4 kgf/cm), feed rate: 0.5 m/min). Thus, a sample stack including a silicon wafer and an adhesive sheet was obtained. The following evaluation test was performed for the stack obtained as described above.

and dried at 120° C. for 1 minute. A cured layer composed of the cured photosensitive resin composition was thus formed on the silicon wafer.

The obtained stack including the silicon wafer and cured layer was individuated into sizes of 3 mm×3 mm. The individuated stack was dried on a hot plate at 120° C. for 10 minutes, and then laminated on a glass panel (10 mm×10 mm×0.55 mm) with the cured layer contacting the glass panel, and compression-bonded at 150° C. for 10 seconds while pressing at 18.6 N (2 kgf). A sample stack including a silicon wafer, a cured layer and a glass panel, laminated in that order, was thus obtained.

The obtained sample was heated in an oven at 180° C. for 3 hours, and further heated on a heating plate at 260° C. for 10 seconds, and then the adhesive force was measured using a shear adhesion tester (trade name: Dage-4000, manufactured by Dage). The measurement results are shown in Tables 2 and 4. The interface, between the cured layer and the glass panel was observed via glass to confirm whether voids occurred in the interface. The evaluation was performed, as A for samples in which voids did not occur at all, B for samples in which occurrence of small voids was observed, and C for samples in which occurrence of large voids or a number of voids were observed. The evaluation results are shown in Tables 2 and 4.

(Pattern Formability)

An adhesive sheet was laminated on a silicon wafer in the same manner as the high-temperature adhesion evaluation test. The obtained stack was exposed to light in the same manner as the test described above, from the adhesive sheet side through a negative pattern mask (trade name: No. G-2, manufactured by Hitachi Chemical Co., Ltd.). Subsequently, the stack was left on a hot plate, and the base was then removed, and the stack was developed, washed with water, and dried in the same manner as the test described above. Thus, an adhesive pattern obtained from the photosensitive resin composition was formed on the silicon wafer.

The formed adhesive pattern was visually observed, and the pattern formability was evaluated, as A for samples in which a thin line pattern having line width/space width=30 μm/30 μm or less was formed, B for samples in which a thin line pattern of more than 30 μm/30 μm and 60 μm/60 μm or less was formed, C for samples in which a thin line pattern of more than 60 μm/60 μm and 400 μm/400 μm or less was formed, and D for samples in which pattern was not formed. The evaluation results are shown in Tables 2 and 4.

(Film Stability Test)

An adhesive sheet was laminated on a silicon wafer in the same manner as the pattern formability evaluation test. After left at room temperature in this state for two weeks, the formation of an adhesive pattern of a photosensitive resin composition was attempted on the silicon wafer in the same manner as the pattern formability evaluation test. The adhesive pattern formed at this time was visually observed, and in the same manner as the pattern formability evaluation test, the pattern formability was evaluated, as A for samples in which a thin line pattern having line width/space width=30 μm/30 μm or less was formed, B for samples in which a thin line pattern of more than 30 μm/30 μm and 60 μm/60 μm or less was formed, C for samples in which a thin line pattern of more than 60 μm/60 μm and 400 μm/400 μm or less was formed, and D for samples in which pattern was not formed. The evaluation results are shown in Tables 2 and 4.

(Reflow Resistance)

In the same manner as the high-temperature adhesion evaluation test, a stack including the silicon wafer and the cured layer was individuated into sizes of 5 mm×5 mm. There was obtained a sample stack including the individuated silicon chip, the adhesive pattern, and the printed circuit board, laminated in that order, using a printed circuit board (glass epoxy board: 15 mm×15 mm×0.15 mm) in place of the glass panel. The obtained sample was heated in an oven at 180° C. for 3 hours. The heated sample was treated for 168 hours under conditions with a temperature of 85° C. and a humidity of 60%, then placed in an environment with a temperature of 25° C. and a humidity of 50%, and thereafter subjected to IR (infrared ray) reflow at 250° C. for 10 seconds, and the presence of peeling was observed with appearance observation and a Scanning Acoustic Tomograph (SAT). The evaluation was performed, as A for samples in which peeling was not observed at all, B for samples in which peeling was not clearly observed by the appearance observation, but was observed by SAT imaging, and C for samples in which peeling was clearly observed by the appearance observation. The evaluation results are shown in Tables 2 and 4.

(Embedding Property for Base with Connecting Terminal)

A silicon chip with a connecting terminal (1 cm×1 cm, a thickness of 400 μm, terminal parts having 40 μm×40 μm, a height of 40 μm, and a pitch of 100 μm were present at regular intervals in two rows along the peripheral part of the chip) was placed on a support stage, and the adhesive sheet was laminated thereover with the adhesive layer contacting the terminal side of the silicon wafer, by a vacuum laminater (temperature: 80° C., pressure: 0.5 MPa, time: 30 seconds). After the base (PET film) was peeled off and removed, the appearance of the exposed adhesive layer was observed with an optical microscope, to confirm whether the lamination could be achieved without generating voids. Satisfactory samples in which no voids occurred around the terminal were defined as A; samples in which voids were observed only in a terminal peripheral part were defined as B; and samples in which remarkable voids were observed not only around the terminal but also on the whole surface were defined as C (improper).

(Tg after Curing)

A Teflon (registered trademark) sheet was placed on a support stage, and the adhesive sheet was laminated thereover by roll pressing (temperature: 60° C., linear pressure: 39.2 N/cm (4 kgf/cm), feed rate: 0.5 m/min). The obtained stack was exposed to light at 1000 mJ/cm$^2$ using a high-precision parallel exposure apparatus (trade name: EXM-1172-B-∞, manufactured by Orc Manufacturing Co., Ltd.), from the base-attached adhesive sheet side, and heated on a hot plate at 80° C. for 30 seconds. After the base (PET film) was peeled off and removed from the adhesive layer, the adhesive layer was subjected to the developing solution for 1 minute with a 2.38 mass % solution of tetramethylammonium hydroxide (TMAH) as the developing solution, under conditions with a temperature of 26° C. and a spray pressure of 0.18 MPa, using a conveyor developing machine (manufactured by Yako Co., Ltd.), and thereafter washed for 6 minutes with purified water at a temperature of 25° C. and a spray pressure of 0.02 MPa. The obtained film was dried on a hot plate at 120° C. for 10 minutes, and then laminated by roll pressing (temperature: 100° C., linear pressure: 39.2 N/cm (4 kgf/cm), feed rate: 0.5 m/min) to a thickness of 80 μm. The Teflon (registered trademark) sheet on one side was peeled off and removed, and repetitive lamination was performed so that adhesive layers were laminated. Thereby, a sample stack including the Teflon (registered trademark) sheet, the adhesive layer, and the Teflon (registered trademark) sheet was obtained. After peeling off and removing the Teflon (registered trademark) sheet on one side, the sample stack was heated in an oven at 180° C. for 3 hours. The heated sample was cut into 5 min-wide strips, and after peeling off the Teflon (registered trademark) sheet on the other side, measurement was performed using a viscoelasticity analyzer (trade name: RSA-2, manufactured by Rheometrix) under conditions with a temperature-elevating rate of 5° C./min, a frequency of 1 Hz and a measuring temperature of −50 to 300° C., to obtain the tan δ peak temperature as Tg. The evaluation results are shown in Tables 2 and 4.

INDUSTRIAL APPLICABILITY

The photosensitive resin composition of the present invention can form the adhesive pattern having sufficient moisture-proof reliability, and therefore is suitably used as an adhesive for manufacture of a high-definition semiconductor package. A film adhesive and adhesive sheet of the present invention, when applied onto an adherend or a supporting member such as a base, glass or a silicon wafer, have more excellent positioning precision than that in a case of using a liquid resin composition. The film adhesive and adhesive sheet of the present invention can improve patterning resolution by exposure to light, while they have low-temperature thermocompression bondability with pattern-formed adherends such as a base, glass and a semiconductor chip, as well as excellent post-thermosetting heat resistance. The film adhesive and adhesive sheet of the present invention can therefore be suitably used for protection of a semiconductor chip, optical element and solid pickup element, or as an adhesive or buffer coat to be applied in fine bonding regions.

REFERENCE SIGNS LIST

1: film adhesive (adhesive layer), 2: cover film, 3: base, 4: mask, 8: semiconductor wafer, 9: conductive layer, 11: opening, 12: semiconductor wafer, 13: supporting member, 14: semiconductor chip, 18: circuit side, 20: semiconductor wafer with adhesive layer, 100, 110: adhesive sheet, 230: semiconductor device

The invention claimed is:

1. A photosensitive resin composition comprising:
an alkali-soluble resin having a phenolic hydroxyl group as an end group and a phenolic hydroxyl group as a side chain group (A);
a radiation-polymerizable compound (B); and
a photoinitiator (C);
wherein a glass transition temperature of the alkali-soluble resin is 40° C. to 120° C.

2. The photosensitive resin composition according to claim 1, wherein the alkali-soluble resin is a polyimide resin obtainable by reacting
a tetracarboxylic dianhydride,
a diamine comprising 10 to 80 mol % of a diamine with a phenolic hydroxyl group based on the total diamine, and
an amine with a phenolic hydroxyl group.

3. The photosensitive resin composition according to claim 2, wherein the diamine comprises 10 to 80 mol % of an aliphatic etherdiamine represented by the following formula (8) based on the total diamine:

(8)

wherein $R^1$ to $R^3$ each independently represent a C1-10 alkylene group; and b represents an integer of 2 to 80.

4. The photosensitive resin composition according to claim 2, wherein the diamine with a phenolic hydroxyl group comprises a diamine with a phenolic hydroxyl group represented by the following formula (A-1):

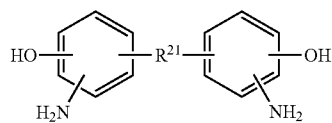

(A-1)

wherein $R^{21}$ represents a single bond or a divalent organic group.

5. The photosensitive resin composition according to claim 1, wherein the alkali-soluble resin is a polyimide resin having only a phenolic hydroxyl group as an alkali-soluble group.

6. The photosensitive resin composition according to claim 1, wherein the radiation-polymerizable compound comprises at least one (meth)acrylate having functionality of three or more.

7. The photosensitive resin composition according to claim 1, further comprising an epoxy resin (D).

8. The photosensitive resin composition according to claim 7, wherein the epoxy resin comprises at least one of a bisphenol F-type epoxy resin and a bisphenol A-type epoxy resin.

9. The photosensitive resin composition according to claim 1, further comprising a compound having an ethylenic unsaturated group and an epoxy group (E).

10. The photosensitive resin composition according to claim 1, further comprising a filler (F).

11. The photosensitive resin composition according to claim 1, further comprising a curing accelerator (G).

12. The photosensitive resin composition according to claim 1 for an adhesive to be used for connecting semiconductor chips, and/or connecting a semiconductor chip and a supporting member for mounting a semiconductor chip.

13. A film adhesive obtainable by forming the photosensitive resin composition according to claim 1 into a film shape.

14. An adhesive sheet comprising a base, and an adhesive layer composed of the film adhesive according to claim 13 formed on the base.

15. An adhesive pattern obtainable by exposing an adhesive layer to light, the adhesive layer composed of the film adhesive according to claim 13 laminated on an adherend, and developing the exposed adhesive layer with an alkali developing solution.

16. A semiconductor wafer with an adhesive layer, comprising:
a semiconductor wafer, and
an adhesive layer composed of the film adhesive according to claim 13 and laminated on the semiconductor wafer.

17. A semiconductor device having a structure in which semiconductor chips are bonded using the photosensitive resin composition according to claim 1 and/or a structure in which a semiconductor chip and a supporting member for mounting a semiconductor chip are bonded using the photosensitive resin composition according to claim 1.

* * * * *